United States Patent
Hanzawa et al.

(10) Patent No.: US 10,186,512 B2
(45) Date of Patent: Jan. 22, 2019

(54) SOLID-STATE IMAGE SENSOR, IMAGE CAPTURING DEVICE, AND ELECTRONIC DEVICE

(71) Applicant: SONY SEMICONDUCTOR SOLUTIONS CORPORATION, Kanagawa (JP)

(72) Inventors: Katsuhiko Hanzawa, Kanagawa (JP); Yuuichi Kaji, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/560,682

(22) PCT Filed: Mar. 18, 2016

(86) PCT No.: PCT/JP2016/058647
§ 371 (c)(1),
(2) Date: Sep. 22, 2017

(87) PCT Pub. No.: WO2016/158482
PCT Pub. Date: Oct. 6, 2016

(65) Prior Publication Data
US 2018/0108658 A1 Apr. 19, 2018

(30) Foreign Application Priority Data
Apr. 3, 2015 (JP) .................................. 2015-076731

(51) Int. Cl.
*H01L 27/092* (2006.01)
*H04N 5/378* (2011.01)
(Continued)

(52) U.S. Cl.
CPC ...... *H01L 27/092* (2013.01); *H01L 27/14643* (2013.01); *H04N 5/365* (2013.01); *H04N 5/378* (2013.01); *H04N 5/37455* (2013.01)

(58) Field of Classification Search
CPC . H01L 27/092; H01L 27/14643; H04N 5/365; H04N 5/37455; H04N 5/378
See application file for complete search history.

(56) References Cited

U.S. PATENT DOCUMENTS 8,154,541 B2 * 4/2012 Koyama .............. G09G 3/3216
345/211
8,704,933 B2 * 4/2014 Yamamoto ............. G02B 7/285
348/335
(Continued)

FOREIGN PATENT DOCUMENTS

EP 2938066 A1 10/2015
JP 2010-288218 A 12/2010
(Continued)

OTHER PUBLICATIONS

International Search Report and Written Opinion of PCT Application No. PCT/JP2016/058647, dated Apr. 12, 2016, 09 pages of ISRWO.

*Primary Examiner* — Padma Haliyur
(74) *Attorney, Agent, or Firm* — Chip Law Group

(57) ABSTRACT

[Object] The present technology relates to a solid-state image sensor, image capturing device, and electronic device, capable of setting a reference voltage applied to a vertical transfer line to be substantially the same as a reset voltage of a floating diffusion portion. [Solution] A reference voltage generation circuit configured to generate the reference voltage includes the same circuit as a reset transistor, an amplification transistor, and a selection transistor in a pixel circuit, and applies it to the vertical transfer line immediately before transferring an optical signal and a reset signal. This allows
(Continued)

the same reference voltage as that immediately after applying the reset signal to the floating diffusion to be applied to the vertical transfer line. The present technology is applicable to CMOS image sensors.

18 Claims, 18 Drawing Sheets

(51) Int. Cl.
    *H01L 27/146*     (2006.01)
    *H04N 5/3745*     (2011.01)
    *H04N 5/365*     (2011.01)

(56) References Cited

U.S. PATENT DOCUMENTS

| | | | |
|---|---|---|---|
| 2008/0198049 A1* | 8/2008 | Maruyama | H03M 1/0845 |
| | | | 341/122 |
| 2010/0315540 A1 | 12/2010 | Hoshino | |
| 2013/0215302 A1 | 8/2013 | Ueno | |
| 2014/0293103 A1 | 10/2014 | Wakabayashi et al. | |
| 2014/0340555 A1* | 11/2014 | Iwane | H04N 5/343 |
| | | | 348/308 |

FOREIGN PATENT DOCUMENTS

| | | |
|---|---|---|
| JP | 2013-090234 A | 5/2013 |
| JP | 2013-168880 A | 8/2013 |
| JP | 2014-161080 A | 9/2014 |
| WO | 2014/097857 A1 | 6/2014 |

\* cited by examiner

FIG. 3
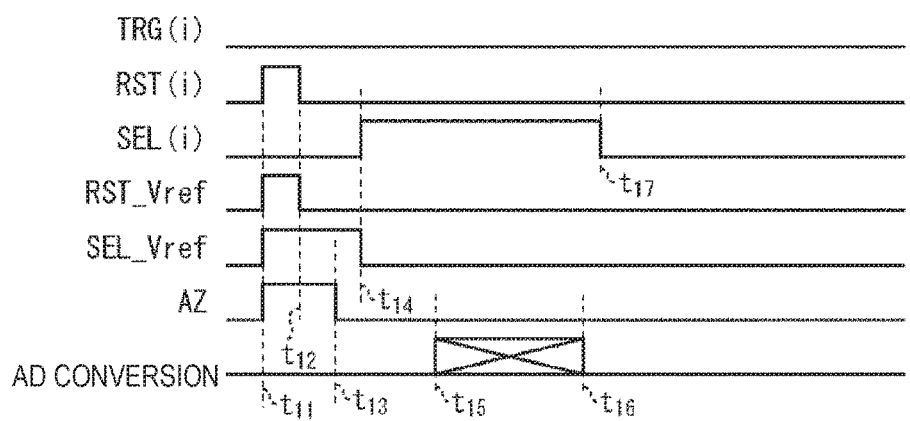
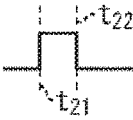
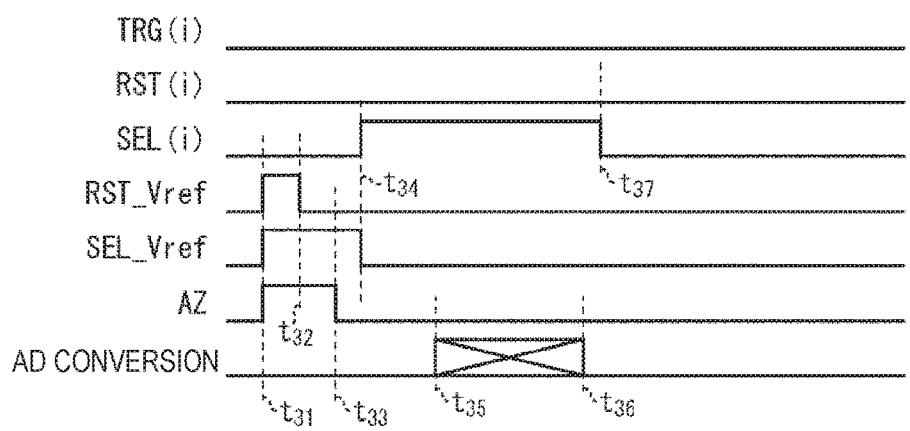

SOLID-STATE IMAGE SENSOR, IMAGE CAPTURING DEVICE, AND ELECTRONIC DEVICE

CROSS REFERENCE TO RELATED APPLICATIONS

This application is a U.S. National Phase of International Patent Application No. PCT/JP2016/058647 filed on Mar. 18, 2016, which claims priority benefit of Japanese Patent Application No. JP 2015-076731 filed in the Japan Patent Office on Apr. 3, 2015. Each of the above-referenced applications is hereby incorporated herein by reference in its entirety.

TECHNICAL FIELD

The present technology relates to solid-state image sensors, image capturing devices, and electronic devices. More particularly, the present technology relates to a solid-state image sensor, an image capturing device, and an electronic device, capable of achieving appropriate analog gain without increasing the range in analog/digital (AD) conversion more than necessary or without increasing the circuit scale.

BACKGROUND ART

In the all-pixel sequential transfer operation, the optical signal can be read after reading the reset signal, and so it is possible to perform the analog correlated double sampling (CDS) used to read the optical signal by setting the reset signal as a reference. However, rolling distortion will occur in the all-pixel sequential transfer operation.

Thus, the all-pixel simultaneous transfer operation in which distortion does not occur in principle has been developed.

The all-pixel simultaneous transfer operation is roughly divided into two modes. In the first mode that is one of two, a memory (MEM) is arranged inside a pixel circuit, and the optical signal is transferred from a photodiode (PD) to the MEM simultaneously for all pixels. Then, the optical signal is read from the MEM using the all-pixel sequential transfer operation described above.

However, the implementation of the first mode is necessary to increase the number of pixel circuits, and so the increase in the number of pixel circuits will cause reduction in the area for receiving the light incident on the PD.

Thus, as the second mode, the FD accumulation-type all-pixel simultaneous transfer operation is developed in which electric charges are simultaneously accumulated in a floating diffusion (FD) instead of MEM, and an optical signal is read from the FD by the all-pixel sequential transfer operation.

Furthermore, the FD accumulation-type all-pixel simultaneous transfer operation has two types of modes.

In the first mode, after resetting the FD, the reset signal is not read, the optical signals are transferred collectively, the optical signal is read, the same pixel is reset again by setting the read optical signal as a reference, and the difference from the reset signal is read.

In this first mode, the analog CDS can be performed. However, the kTC noise (noise that changes every reset and its value is proportional to the square root of kTC, where k is Boltzmann's constant, T is temperature, and C is capacitance) of the pixel fails to be removed in principle, and so different noise signals will be superimposed on both the optical signal and the reset signal.

In addition, in the second mode, the reset signals of all the pixels are read, are stored in the frame memory, and are exposed. Electric charges are accumulated by the PD using photoelectric conversion and then are transferred simultaneously from the PD to the FD. The optical signal is read from the FD by the all-pixel sequential transfer operation.

In this second mode, although the frame memory is necessary, the analog CDS can be performed, and the same kTC noise is included in each of the reset signal and the optical signal, so it is possible to cancel out the kTC noise by the analog CDS, as compared with the first mode.

However, in the all-pixel sequential transfer operation, the reset signal serving as a reference is read after reading the optical signal. Thus, in the configuration described above, an operating point serving as a reference in the column amplifier is not determined and an appropriate pixel signal is likely to fail to be output.

Thus, a technology is developed in which a circuit that generates the reference voltage is provided (refer to Patent Literature 1). In this technology, the image capturing is performed in the same sensor using the all-pixel sequential transfer operation during image capturing and using the FD accumulation-type all-pixel simultaneous transfer operation during the auto exposure (AE) or auto focus (AF), which is based on the reference voltage that is output from the circuit.

In other words, in the FD accumulation-type all-pixel simultaneous transfer operation, a signal serving as a reference at the time of resetting is read after reading the optical signal. Thus, in the description of Patent Literature 1, the column amplifier operation can be achieved by outputting a fixed reference voltage using the circuit that performs the auto-zero (AZ) operation.

CITATION LIST

Patent Literature

Patent Literature 1: JP 2014-161080A

DISCLOSURE OF INVENTION

Technical Problem

However, in the case of generating a voltage serving as a reference using the auto-zero (AZ) operation, if the reference voltage deviates from the level of the reset signal, in some cases, the increase in analog gain can fail to be achieved and the range of analog/digital (AD) conversion should be made larger than necessary.

In addition, if the reference voltage is fixed, in some cases, it will deviate from the level of the reset signal due to chip variation or temperature characteristics.

Furthermore, in a case of introducing a mechanism that takes into consideration the chip temperature or process variation, the circuit scale will increase in some cases.

The present technology is made in view of such a situation, and in particular, can achieve appropriate analog gain without increasing the range in analog/digital (AD) conversion more than necessary or without increasing the circuit scale.

Solution to Problem

A solid-state image sensor according to an aspect of the present technology includes: a source follower circuit configured to generate a reference voltage. A gate voltage of an amplification transistor included in the source follower circuit is equal to a reset voltage in resetting an electric charge accumulated in a floating diffusion that accumulates an electric charge generated by a photodiode included in a pixel circuit for each pixel. A switch is disposed on a wiring between the gate and a power supply that applies a voltage to the gate, and the switch, when being turned off, sets the voltage to be applied to the gate to be a value equal to a voltage of the floating diffusion obtained after the resetting.

The source follower circuit can be caused to generate the reference voltage when the switch is turned on.

The source follower circuit can be caused to be set for each column divided in a horizontal direction, be provided for each vertical transfer line that transfers a signal of each pixel in a vertical direction, and apply the reference voltage to the vertical transfer line.

A plurality of the adjacent vertical transfer lines can be caused to be connected to each other by commonly using a gate of a transistor serving as the switch.

The adjacent vertical transfer lines can be caused to be connected to each other via a switch and the switch can be caused to be turned on at a timing immediately before reading the signal of the pixel.

A power supply that supplies the reset voltage and a power supply that supplies a voltage as the reference voltage via the switch can be caused to be identical power supplies.

A power supply that supplies the reset voltage and a power supply that supplies a voltage as the reference voltage via the switch can be caused to be individual power supplies.

A signal of the pixel to be output via the vertical transfer line can be caused to be output to an auto-zero circuit.

A signal of the pixel to be output via the vertical transfer line can be caused to be output to an analog/digital (AD) converter.

A main body circuit configuration can be caused to include one chip.

A main body circuit configuration can be caused to include a plurality of chips.

In a case where the main body circuit configuration includes two chips, the pixel circuit can be caused to be included in a first chip and the source follower circuit and an analog/digital (AD) converter can be caused to be included in a second chip.

In a case where the main body circuit configuration includes two chips, the pixel circuit and the source follower circuit can be caused to be included in a first chip and an analog/digital (AD) converter can be caused to be included in a second chip.

In a case where the main body circuit configuration includes two chips, the pixel circuit, the source follower circuit, and a comparator of an analog/digital (AD) converter can be caused to be included in a first chip and a counter of the analog/digital (AD) converter can be caused to be included in a second chip.

The source follower circuit can be caused to be provided for each area transfer line used to transfer a signal of each pixel in each of areas divided in a two-dimensional direction, and apply the reference voltage to the area transfer line.

A main body circuit configuration can be caused to include a first chip including the pixel circuit provided for each of the areas and a second chip including a source follower circuit provided for each of the areas.

An image capturing device according to an aspect of the present technology includes: a source follower circuit configured to generate a reference voltage. A gate voltage of an amplification transistor included in the source follower circuit is equal to a reset voltage in resetting an electric charge accumulated in a floating diffusion that accumulates an electric charge generated by a photodiode included in a pixel circuit for each pixel. A switch is disposed on a wiring between the gate and a power supply that applies a voltage to the gate, and the switch, when being turned off, sets the voltage to be applied to the gate to be a value equal to a voltage of the floating diffusion obtained after the resetting.

An electronic device according to an aspect of the present technology includes: a source follower circuit configured to generate a reference voltage. A gate voltage of an amplification transistor included in the source follower circuit is equal to a reset voltage in resetting an electric charge accumulated in a floating diffusion that accumulates an electric charge generated by a photodiode included in a pixel circuit for each pixel. A switch is disposed on a wiring between the gate and a power supply that applies a voltage to the gate, and the switch, when being turned off, sets the voltage to be applied to the gate to be a value equal to a voltage of the floating diffusion obtained after the resetting.

According to an aspect of the present technology, a source follower circuit configured to generate a reference voltage is included. A gate voltage of an amplification transistor included in the source follower circuit is equal to a reset voltage in resetting an electric charge accumulated in a floating diffusion that accumulates an electric charge generated by a photodiode included in a pixel circuit for each pixel. A switch is disposed on a wiring between the gate and a power supply that applies a voltage to the gate, and the switch, when being turned off, sets the voltage to be applied to the gate to be a value equal to a voltage of the floating diffusion obtained after the resetting.

Advantageous Effects of Invention

According to one embodiment of the present technology, it is possible to implement a solid-state image sensor capable of obtaining appropriate analog gain without increasing the range in analog/digital (AD) conversion more than necessary or without increasing the circuit scale.

BRIEF DESCRIPTION OF DRAWINGS

FIG. 3 is a timing chart illustrated to describe the operation of the solid-state image sensor of FIG. 1.

MODE(S) FOR CARRYING OUT THE INVENTION

Examples of best modes for carrying out the present invention will be described below, but the present invention is not limited to the following examples.

First Embodiment

<Exemplary Configuration of Solid-State Image Sensor>

Figure 1:
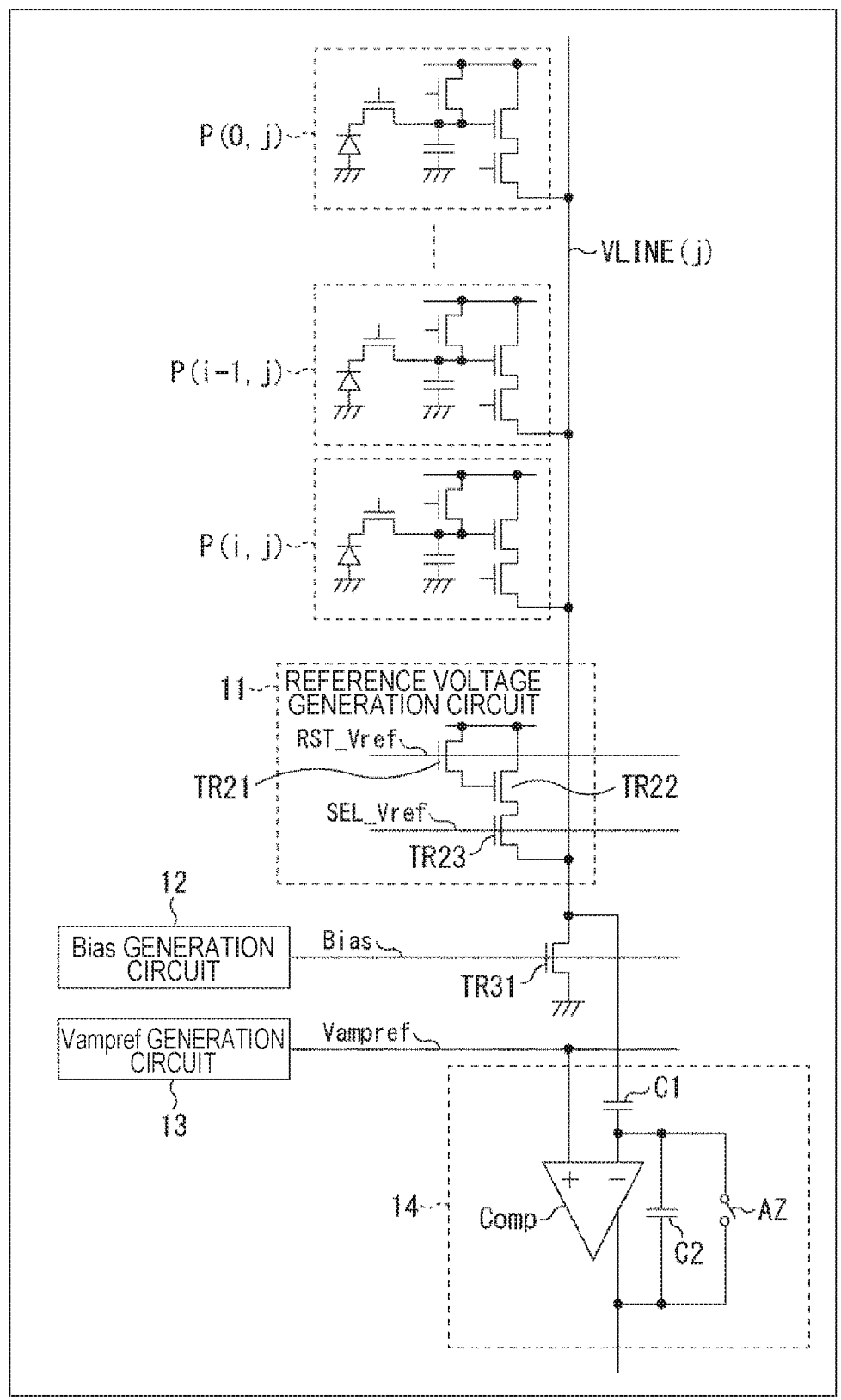
FIG. 1 is a diagram illustrated to describe an exemplary configuration according to a first embodiment of a solid-state image sensor to which the present technology is applied.

FIG. 1 illustrates the configuration of one of a plurality of vertical signal lines connected to pixels that are included in a solid-state image sensor as a semiconductor device to which the present technology is applied.

The solid-state image sensor is an element that captures an image, and, in one example, includes an image sensor with a size of m by n pixels in the horizontal and vertical direction. In a case where there is no pixel shared in the floating diffusion portion, m vertical signal lines that are the same in number as the pixel columns in the horizontal direction are provided, and furthermore, a pixel circuit including n pixels equivalent to the number of pixels in the vertical direction is connected to each vertical signal line. Moreover, in a case where the floating diffusion portion is shared, the number of vertical signal lines does not match the number of pixels, in some cases.

FIG. 1 illustrates an exemplary configuration of a vertical transfer line VLINE (j) in the j-th column and the periphery thereof in the solid-state image sensor. Pixels P (0, j) to P (i, j (i=n)) that are included in a pixel circuit, a reference voltage generation circuit 11, a Bias generation circuit 12, a Vampref generation circuit 13, and an auto-zero circuit 14 are connected to the vertical transfer line VLINE (j).

Figure 2:
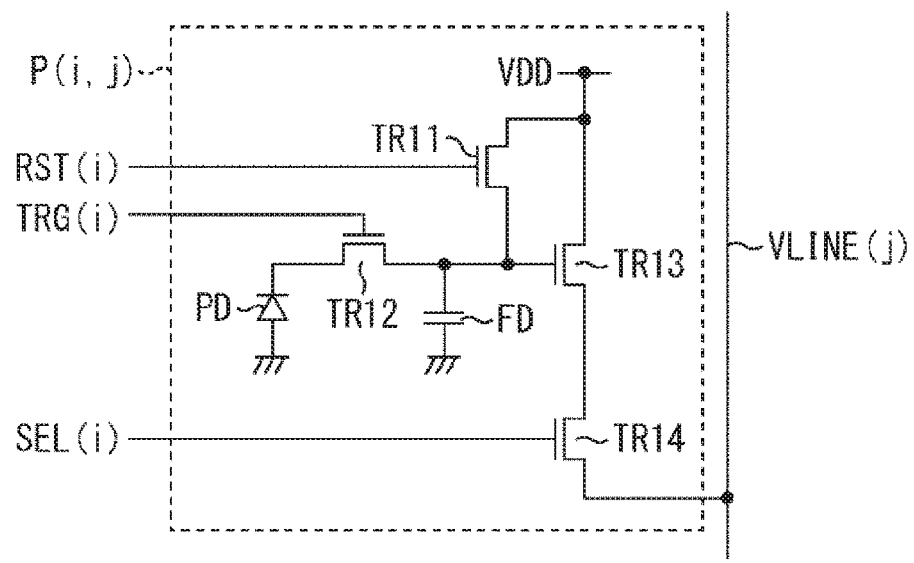
FIG. 2 is a diagram illustrated to describe details of a pixel circuit.

FIG. 2 illustrates an exemplary configuration of the pixel P (i, j) that is included in the pixel circuit. Each pixel P (i, j) has a photodiode PD, a reset transistor TR11, a transfer transistor TR12, an amplification transistor TR13, a selection transistor TR14, and a floating diffusion portion FD. The floating diffusion portion FD is also simply referred to as an FD portion, and the photodiode PD is also simply referred to as a PD hereinafter.

In each pixel P (i, j), the electric charge obtained by the photoelectric conversion of the PD is transferred to the FD portion via the transfer transistor TR12 and is held therein. When the selection transistor TR14 is turned on in response to a selection signal SEL (i), the electric charge held in the FD portion as described above is amplified by the amplification transistor TR13 and is output as a pixel signal to the vertical transfer line VLINE (j).

In one example, the FD portion converts the electric charge transferred from the PD into a voltage by accumulating the electric charge as capacitance, and inputs the converted voltage (the voltage of capacitance of the FD portion) to the gate of the amplification transistor TR13. Then, during the period when the selection transistor TR14 is turned on, a source follower circuit is configured to include the amplification transistor TR13, the selection transistor TR14, and a constant current source TR31 (FIG. 1) connected to the vertical transfer line VLINE (j). This allows the signal that constitutes the pixel P (i, j) selected by the selection signal SEL (i) is transmitted to the vertical transfer line VLINE (j).

In addition, when a reset signal RST (i) and a transfer signal TRG (i) are both set to the high level, the reset transistor TR11 and the transfer transistor TR12 are turned on, thereby performing the pixel resetting in which the electric charge accumulated in the FD portion and in the PD is reset. Moreover, the configuration of each P (i, j) in FIG. 1 is similar to that illustrated in FIG. 2. In FIG. 1 or thereafter, in particular, although no reference numeral is attached to each circuit that is included in the P (i, j), it is assumed to be the same as the configuration described with reference to FIG. 2 unless otherwise noted.

The description is given below by referring back to FIG. 1.

The reference voltage generation circuit 11 is configured to include transistors TR22 and TR23 connected in series between a power supply VDD and the vertical transfer line VLINE (j). The reference voltage generation circuit 11 is configured to further include a transistor TR21 that controls the opening and closing of the gate of the transistor TR22. In addition, the transistor TR23 is controlled to be turned on or off by a selection signal SEL_Vref supplied from the same power supply as the selection signal SEL (i). In addition, the transistor TR21 is controlled to be turned on or off by a reset signal RST_Vref supplied from the same power supply as the reset signal RST (i).

In other words, during the period in which the transistor TR23 is turned on, the reference voltage generation circuit 11 is supplied with the power supply voltage from a predetermined power supply VDD. In this case, the reference voltage generation circuit 11 has a function of clipping the voltage of the vertical transfer line VLINE (j) to the voltage dropped by a threshold voltage of the transistor TR22. Furthermore, the transistors TR21, TR22, and TR23 have the same configuration (same configuration including internal resistance, internal capacitance, or the like) as the transistors TR11, TR13, and TR14, respectively. Thus, in one example, there is a case where the reset signal RST_Vref and the selection signal SEL_Vref are set to the high level and the transistors TR21 to TR23 are all turned on. In this case, it is possible to clip the voltage of the vertical transfer line VLINE (j) with the voltage equivalent to the voltage in resetting the FD of each pixel P (i, j), in a similar way to the case where the reset signal RST (i) and the selection signal SEL (i) are both set to the high level and the transistors TR11, TR13, and TR14 are all turned on.

The Bias generation circuit 12 applies a voltage to the gate of the constant current source transistor TR31 depending on the gate voltage and determines the current amount of the vertical signal line VLINE (j).

The Vampref generation circuit 13 supplies a reference voltage Vampref to the auto-zero circuit 14. The auto-zero circuit 14 is configured to include a comparator Comp, capacitors C1 and C2, and a switch AZ. The negative input terminal of the comparator Comp is connected to the vertical transfer line VLINE (j) via the capacitor C1, and the reference voltage Vampref is applied to the positive input terminal thereof. In the comparator Comp, the capacitor C1 samples and holds the voltage of the vertical transfer line VLINE (j) during the period when the switch AZ is turned on, and the voltage is set as a reference voltage.

In other words, the switch AZ is turned on when the amplifier is reset, and so the amplifier reset that sets the reference voltage for the amplification operation of an amplification unit having the comparator Comp and the capacitors C1 and C2 is performed. Thus, the comparator Comp inverts and amplifies the variation with respect to the voltage (reference voltage) of the vertical transfer line VLINE (j) during the period when the switch AZ is turned on. Moreover, the reference voltage that is set by the amplifier reset is held in the capacitor C1 as described above.

In one example, the comparator Comp inverts and amplifies the reset signal (noise signal) output to the vertical transfer line VLINE (j) on the basis of the reference voltage that is set by the amplifier reset. Then, the inverted and amplified reset signal (noise signal) is output.

In addition, the comparator Comp inverts and amplifies the optical signal that is output to the vertical transfer line VLINE (j) on the basis of the reference voltage that is set by the amplifier reset. Then, the inverted and amplified optical signal is output.

Here, the reset signal (noise signal) is a signal including a noise component obtained when the FD portion is reset, and the optical signal is a signal that includes a signal component corresponding to the electric charge generated by the PD and a noise component obtained when the FD portion is reset.

These reset and optical signals are output, and so the CDS is performed and the pixel signal is output.

<First Operation Method>

Next, the operation of the solid-state image sensor of FIG. 1 is described with reference to the timing chart of FIG. 3.

First, in the first operation, the PDs are reset collectively for all the pixels of the solid-state image sensor. In other words, in this case, the reset signal RST (i) and the transfer signal TRG (i) are both set to the high level for a predetermined time, and the reset transistor TR11 and the transfer transistor TR12 are turned on. This allows the pixel reset that resets the electric charge accumulation of the FD portion and the PD to be performed. Moreover, this operation is not illustrated in particular in a waveform in FIG. 3.

Next, in the second operation, the PDs of all the pixels are exposed. This exposure allows photoelectric conversion to be performed to accumulate the electric charge corresponding to the amount of incident light in the PD of each pixel.

In the third operation, a FD reset signal is read. More specifically, as illustrated in the upper part of FIG. 3, the reset signal RST (i), the reset signal RST_Vref, and the selection signal SEL_Vref are set to the high level at time t11. In addition, a switch signal AZ that controls the switch is set to the high level so that the switch AZ of the auto-zero circuit 14 is turned on.

With this operation, the transistor TR11 is turned on, and the FD is set to the voltage of the power supply VDD. In addition, the transistors TR21 and TR23 of the reference voltage generation circuit 11 are turned on, and accordingly, the power supply VDD is supplied to the gate of the transistor TR22, and so the transistor TR22 is turned on. The voltage corresponding to the power supply VDD is applied to the vertical transfer line VLINE (j) as a reference voltage via the transistors TR22 and TR23.

Furthermore, at this event, the switch AZ of the auto-zero circuit 14 is turned on, and so the voltage corresponding to the reset signal of the FD is accumulated in the capacitor C1.

Then, at time t12 when a predetermined time elapses, the reset signals RST (i) and RST_Vref are set to the low level, and the transistors TR11, TR21 and TR22 are turned off. Then, at time t13 after the lapse of a predetermined time, the switch AZ is set to the low level, and further, at time t14 after the lapse of a predetermined time, the selection signal SEL_Vref is set to the low level and the transistor TR23 is turned off. In addition, when the selection signal SEL_Vref is set to the low level, and at the same time, the selection signal SEL (i) is set to the high level. This operation allows the transistor TR14 to be turned on and the reset signal of the FD to be output to the vertical transfer line VLINE (j). Then, when the reset signal of the FD is output to the vertical transfer line VLINE (j), the reset signal of the FD is analog/digital (AD) converted at time t15 to t16, and the reset signal is output as a digital signal. At time t17 after outputting the reset signal as the digital signal, the selection signal SEL (i) is set to the low level and the transistor TR14 is turned off.

The processing as described above is repeated until the processing of all the pixels in the unit of the pixel P (i, j) is completed for each vertical transfer line LINE (j), and the reset signal of the FD is read by the third operation.

Moreover, the upper and lower parts in FIG. 3 illustrate timing of each of the transfer signal TRG (i), the reset signal RST (i), the selection signal SEL (i), the reset signal RST_Vref to the reference voltage generation circuit 11, the selection signal SEL_Vref to the reference voltage generation circuit 11, the control signal AZ of the switch AZ, and the AD conversion, in this order from the top. They are illustrated in one state of the high level and the low level, and only the processing timing of the AD conversion is in the high-level state. Moreover, (i) represents that i-th pixel P (i, j) is specified from the top among the 0-th to m-th pixels connected to the vertical transfer line VLINE of the j-th column.

In the fourth operation, as illustrated in the middle part of FIG. 3, the transfer signal TRG (i) (i=all) of all the pixels P (i, j) is set to the high level for a predetermined period from time t21 to t22. This allows the transistor TR12 to be turned on, and so the electric charges generated in the PD are transferred collectively to the FD during the exposure period.

In the fifth operation, the electric charge accumulated in the FD portion is read as the optical signal. More specifically, as illustrated in the lower part of FIG. 3, at time t31, the reset signal RST_Vref and the selection signal SEL_Vref, of the reference voltage generation circuit 11 and the control signal AZ of the switch AZ of the auto-zero circuit 14 are set to the high level, and the transistors TR21 to TR23 are turned on. In addition, at time t32 after the lapse of a predetermined time, the reset signal RST_Vref is set to the low level, and then, at time t33, the control signal AZ is set to the low level. Furthermore, then, at time t34, the selection signal SEL_Vref to the reference voltage generation circuit 11 is set to the low level and the selection signal SEL (i) to the transistor TR14 is set to the high level, and so the reference voltage of the capacitor C1 is accumulated, the transistors TR13 and TR14 are turned on, and the optical signal corresponding to the electric charge accumulated in the FD portion is output to the vertical transfer line VLINE (j) via the transistors TR13 and TR14.

Then, when the optical signal of the FD is output to the vertical transfer line VLINE (j), the optical signal of the FD is analog-to-digital (AD) converted at time t35 to t36, and the optical signal is output as the digital signal. At time t37 after outputting the optical signal as the digital signal, the selection signal SEL (i) is set to the low level and the transistor TR14 is turned off.

The operation described above makes it possible to set the reference voltage substantially the same as the reset voltage by the reference voltage generation circuit 11 even in the reset signal or in the optical signal. In addition, the configuration of the transistors TR21, TR22, and TR23 in the reference voltage generation circuit 11 is the same as that of the transistors TR11, TR13, and TR14, and so the reference voltage generated by the reference voltage generation circuit 11 can have the same influence as that in temperature characteristics or processing when the FD is reset. Thus, it is possible to achieve appropriate analog gain by generating the reference voltage that is substantially the same as the reset voltage even if the influence of temperature or processing occurs. In addition, a circuit used to deal with the temperature characteristics or the adjustment based on individual differences depending on the influence of temperature or processing is unnecessary to be provided, and so the necessity to increase the size of the device configuration more than necessary is eliminated, and the labor for the processing can be made simpler.

Second Embodiment

In the above, the example of operating in units of the vertical transfer line VLINE (j) is described. However, in one example, the adjacent vertical transfer lines VLINE (j) may be connected to each other via a switch, and when the reset signal is read and when the optical signal is read, they may be connected by turning on the switch immediately before the reading.

Figure 4:
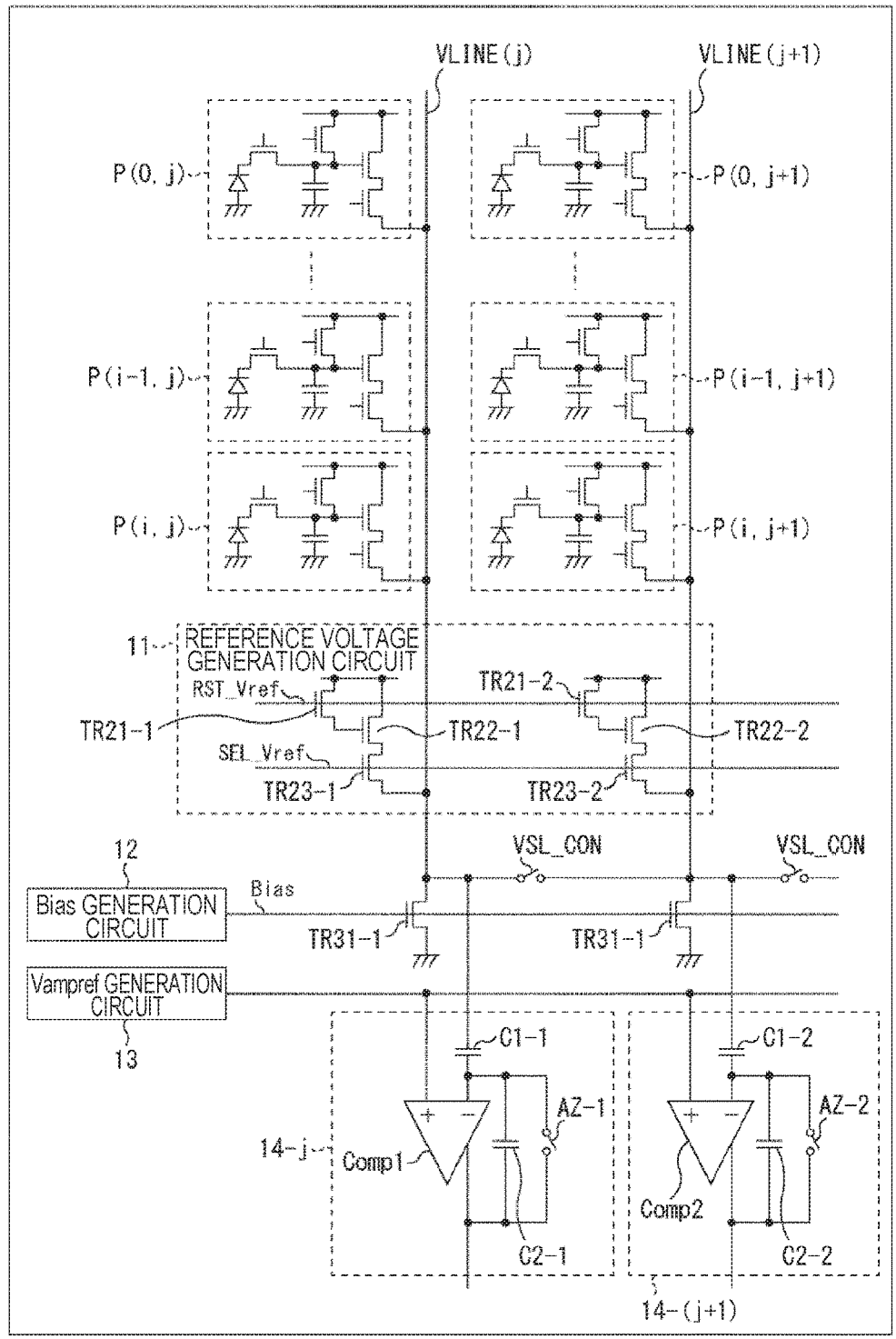
FIG. 4 is a diagram illustrated to describe an exemplary configuration of a second embodiment of the solid-state image sensor to which the present technology is applied.

FIG. 4 illustrates an exemplary configuration of a solid-state image sensor in which the vertical transfer lines VLINE (j) are connected to each other via a switch. Moreover, in the exemplary configuration of the solid-state image sensor in FIG. 4, the same names and reference numerals are given to the same components as those of the configuration in FIG. 1, and description thereof will be omitted as appropriate. In other words, the solid-state image sensor of FIG. 4 is different from the solid-state image sensor of FIG. 1 in that the adjacent vertical transfer lines VLINE (j) are connected via a switch VSL_CON. Thus, the reset signal RST_Vref and the selection signal SEL_Vref in the reference voltage generation circuit 11, the Bias voltage from the Bias generation circuit 12, and the Vampref voltage from the Vampref generation circuit 13 are commonly used by the vertical transfer lines VLINE (j).

The switch VSL_CON is controlled to be turned on immediately before when reading the reset signal and when reading the optical signal. This operation makes it possible for the kTC noise generated at each of the vertical transfer lines VLINE (j) to be set to substantially zero. In other words, although the kTC noise varies depending on the timing of switching, if the switch VSL_CON is turned on, the vertical transfer lines VLINE (j) are all connected, and so the kTC noise components generated in the vertical transfer lines VLINE (j) are added and cancelled out against each other.

<Second Operation Method>

Next, the operation of the solid-state image sensor of FIG. 4 is described with reference to the timing chart of FIG. 5. Moreover, time t101 to t107, time t111 to t112, and time t121 to t127 in the timing chart of FIG. 5 correspond respectively to time t11 to t17, time t21 to t22, and time t31 to t37 in that of FIG. 3. In addition, the timing chart of FIG. 5 is different from the timing chart of FIG. 3 in that an item indicating a control signal that controls the operation of a switch VSC_CON is provided additionally in the second row from the bottom in the upper and lower parts of FIG. 5.

Figure 5:
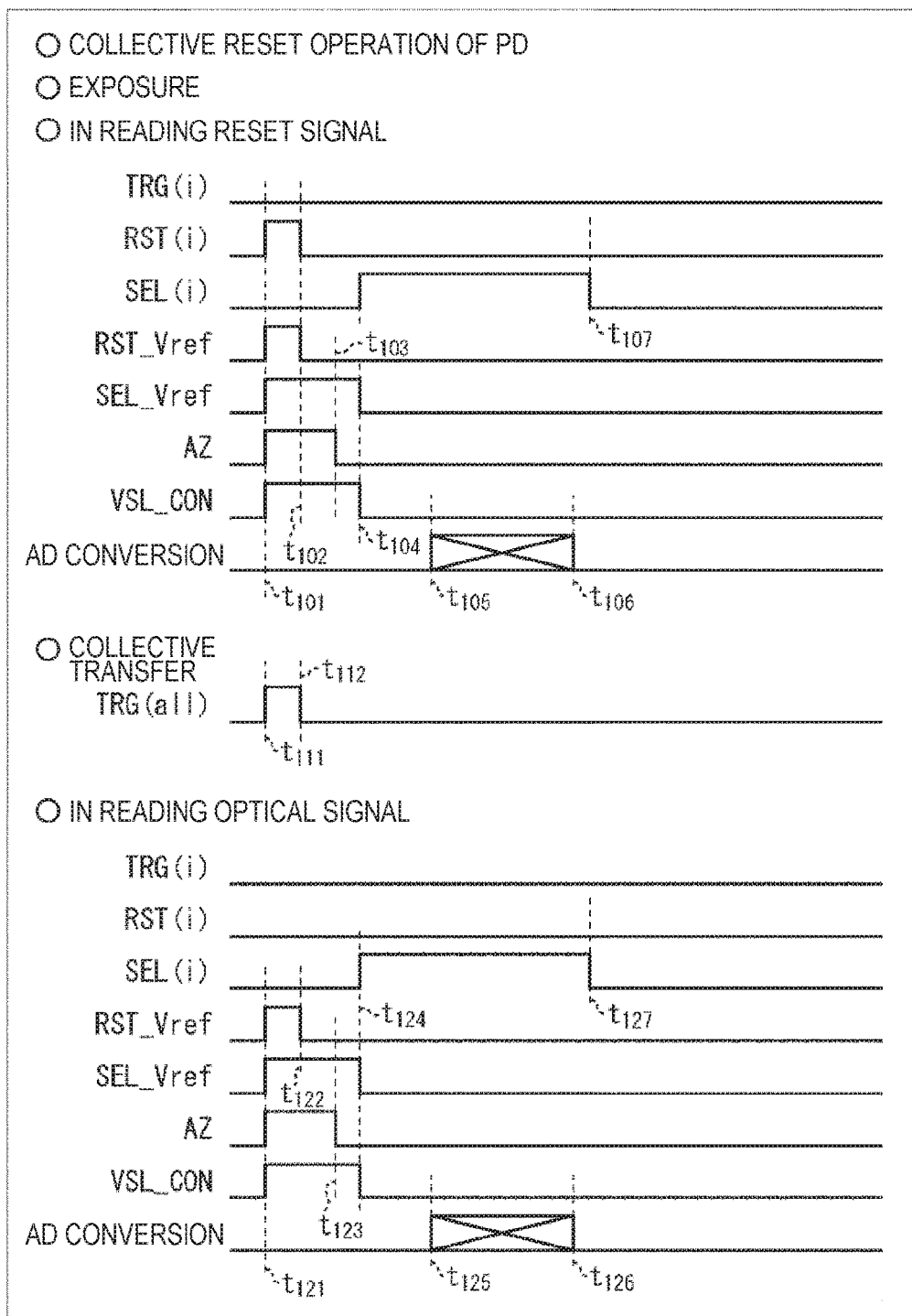
FIG. 5 is a timing chart illustrated to describe the operation of the solid-state image sensor of FIG. 4.

Specifically, as illustrated in the upper part of FIG. 5, at time t101 to t104 of timing of reading the reset signal, the control signal that controls the operation of the switch VSC_CON is set to the high level, and the switches VSC_CON of all the vertical transfer lines VLINE (j) are controlled to be turned on.

Consequently, the vertical transfer lines VLINE (j) are all connected electrically, and so it is possible to generate a reference voltage that is substantially the same voltage as the reset signal while canceling out the kTC noise caused by the switching in reading the reference voltage.

Similarly, as illustrated in the lower part of FIG. 5, at time t121 to t124 of the timing of reading the optical signal, the control signal that controls the operation of the switch VSC_CON is set to the high level, and the switches VSC_CON of all the vertical transfer lines VLINE (j) are controlled to be turned on.

Thus, the vertical transfer lines VLINE (j) are all connected electrically, and so it is possible to generate a reference voltage that is substantially the same voltage as the reset signal while cancelling out the kTC noise caused by the switching in the reading of the reference voltage.

Consequently, the reference voltage generated by the reference voltage generation circuit 11 can have the same influence as that of temperature characteristics or processing when the FD portion is reset. Thus, it is possible to generate, as the reference voltage, a voltage that is substantially the same as the reset voltage even if the influence of temperature or processing occurs. In addition, a circuit used to deal with the temperature characteristics is unnecessary to be provided, and so the necessity to increase the size of the device configuration more than necessary is eliminated.

Third Embodiment

In the above, the description is given of the example in which, when the transistor TR11 to be opened or closed by the reset signal RST (i) is turned on, the voltage at the reset level that is set and the voltage to be supplied to the drain of the amplification transistor TR13 are all supplied from the common power supply VDD in the configuration of each pixel P (i, j). However, the power supplies to be supplied to the transistors TR11 and TR13 may be independent from each other. In such a case, the transistors TR21 and TR22 of the reference voltage generation circuit 11 have the similar structure. This makes it possible to set the reference voltage that is set by the reference voltage generation circuit 11 to an appropriate voltage that is substantially the same as the reset voltage.

Figure 6:
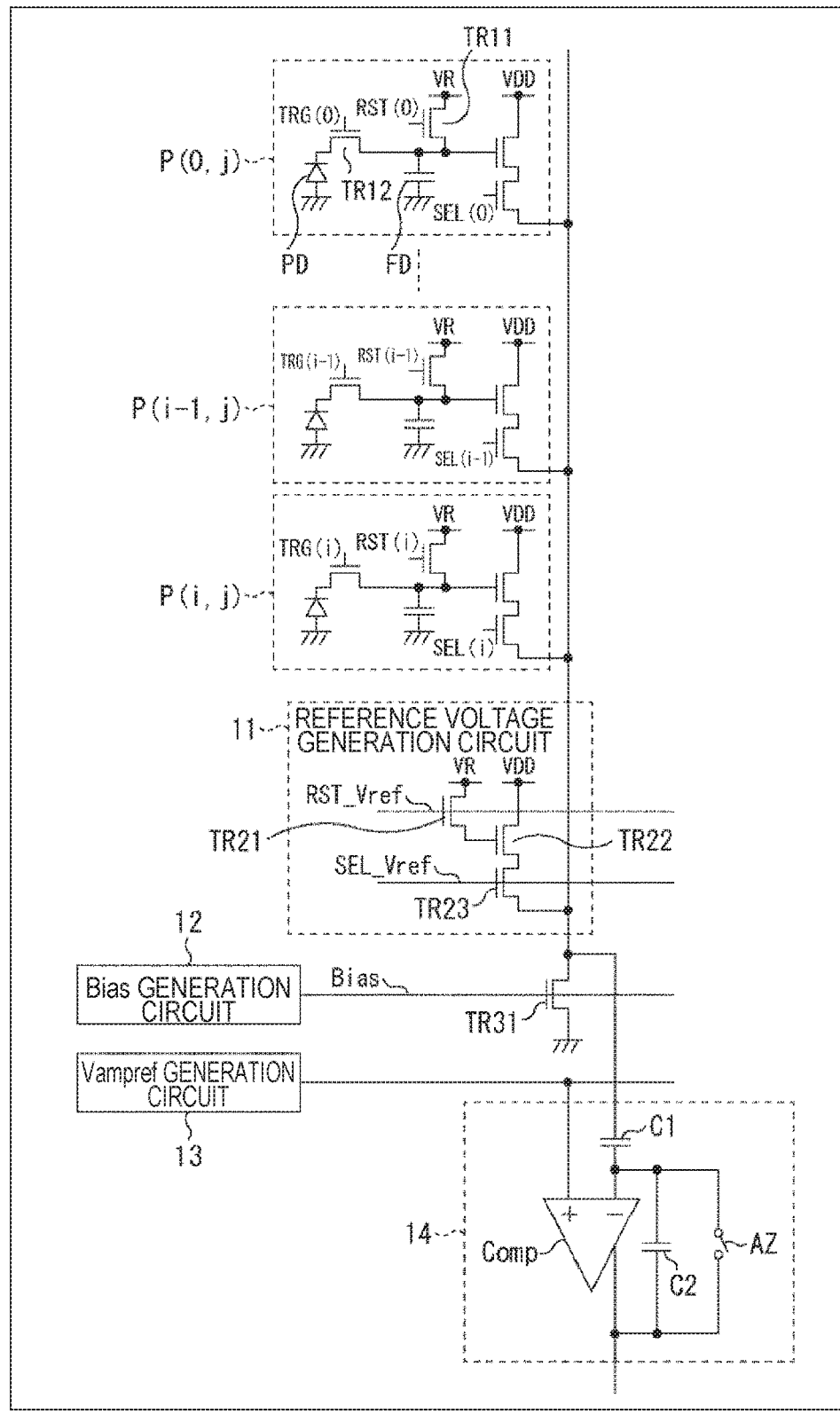
FIG. 6 is a diagram illustrated to describe an exemplary configuration according to a third embodiment of the solid-state image sensor to which the present technology is applied.

FIG. 6 illustrates an exemplary configuration of a solid-state image sensor in which power supplies to be supplied to the transistors TR11 and TR13 are independent from each other. In other words, the power supplies supplied to the transistors TR11 and TR13 are independent power supplies VR and VDD, respectively. Thus, also in the reference voltage generation circuit 11, the power supplies supplied to the transistors TR21 and TR22 are similarly independent power supplies VR and VDD, respectively.

Such a configuration makes it possible to generate the voltage substantially the same as the reset voltage in the pixel P (i, j) as the reference voltage.

Fourth Embodiment

Although the above description is given of the example in which the reset signal and the optical signal of the pixel P (i, j) are output to the comparator Comp via the vertical transfer line VLINE (j), these signals may be directly output to an analog/digital (AD) converter.

Figure 7:
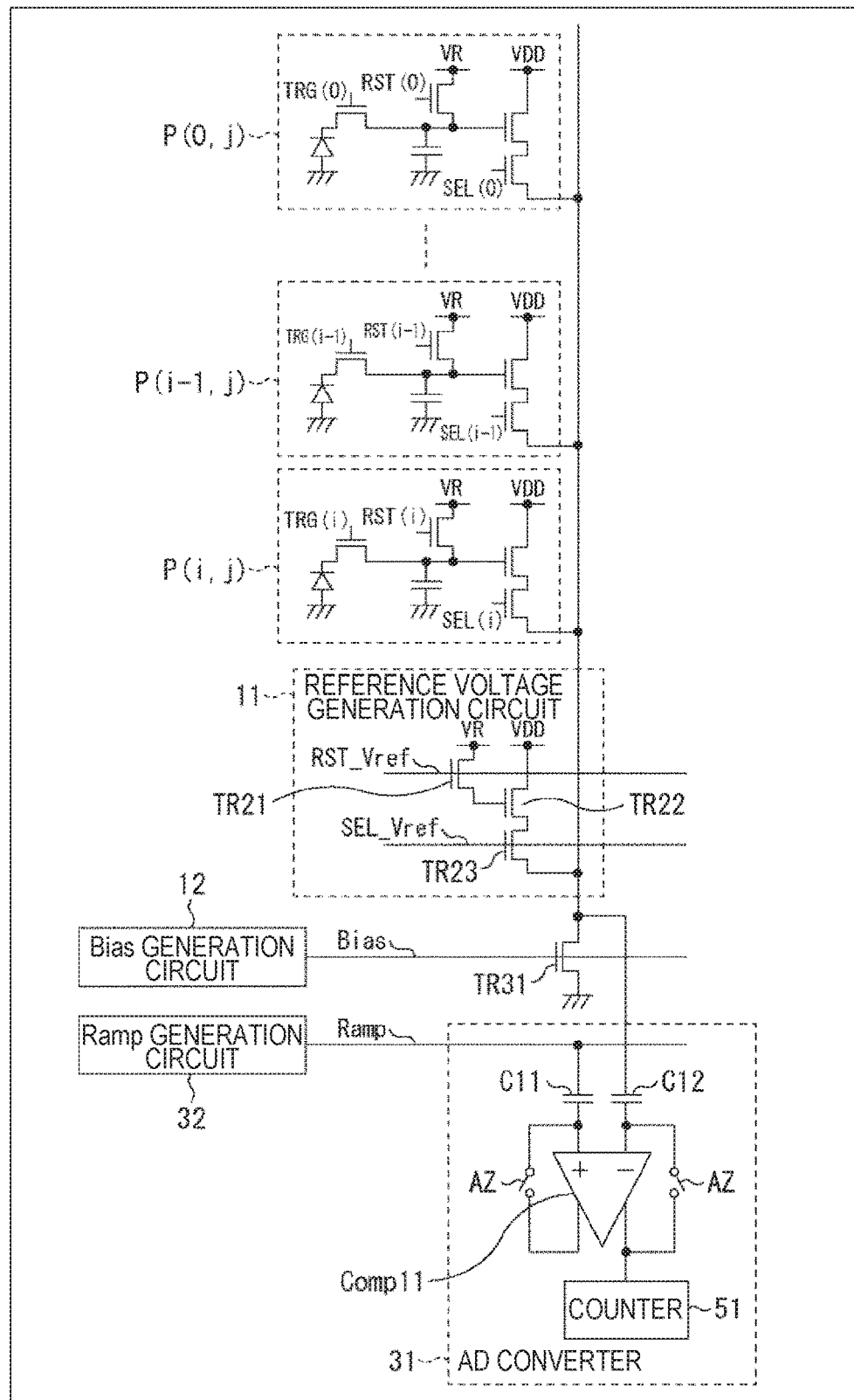
FIG. 7 is a diagram illustrated to describe an exemplary configuration of a fourth embodiment of the solid-state image sensor to which the present technology is applied.

FIG. 7 illustrates an exemplary configuration of a solid-state image sensor in which the reset signal and the optical signal of the pixel P (i, j) are output to an AD converter via the vertical transfer line VLINE (j). Moreover, in FIG. 7, the same names and reference numerals are given to the same configuration as the configuration of FIG. 6, and so the description thereof will be omitted as appropriate.

In other words, the solid-state image sensor of FIG. 7 is different from the solid-state image sensor of FIG. 6 in that a Ramp generation circuit 32 and an AD converter 31 are provided, instead of the Vampref generation circuit 13 and the comparator Comp, respectively. The AD converter 31 is configured to include capacitors C11 and C12, switches AZ associated with the capacitors C11 and C12, a comparator Comp 11, and a counter 51.

The AD converter 31 is a so-called single-slope AD converter, and converts a pixel signal obtained by the difference between the optical signal and the reset signal using the counter 51 from the analog signal to the digital signal on the basis of the lamp voltage supplied from the Ramp generation circuit 32, and outputs it. Moreover, the AD converter 31 may be other than the single-slope type.

As illustrated in the solid-state image sensor of FIG. 7, even in the configuration in which the reset signal and the optical signal are all directly output to the AD converter, the reference voltage generation circuit 11 allows the reference voltage that is substantially the same as the reset voltage at the pixel P (i, j) to be generated without being affected by individual differences caused by temperature characteristics or processing.

Fifth Embodiment

Figure 8:
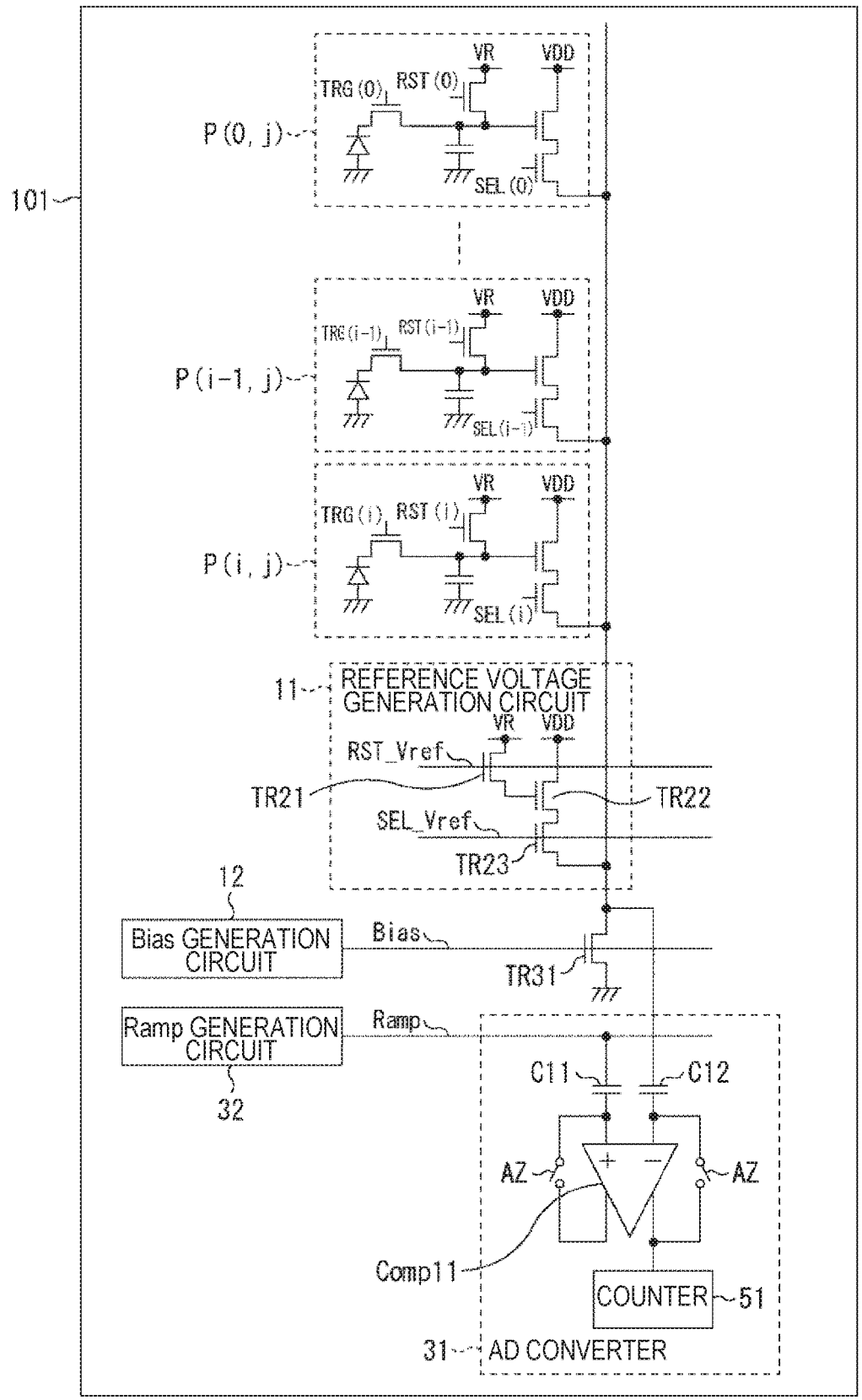
FIG. 8 is a diagram illustrated to describe an exemplary configuration of a fifth embodiment of the solid-state image sensor, which includes one chip, to which the present technology is applied.

The configuration of the main body circuit that is included in the solid-state image sensor may, in one example, include one chip (circuit board) 101 as illustrated in FIG. 8, but it may include two or more chips. In other words, in one example, as illustrated in the left part of FIG. 9, it includes two chips 101-1 and 101-2, and a wire 111 may electrically connect them to each other.

Figure 9:
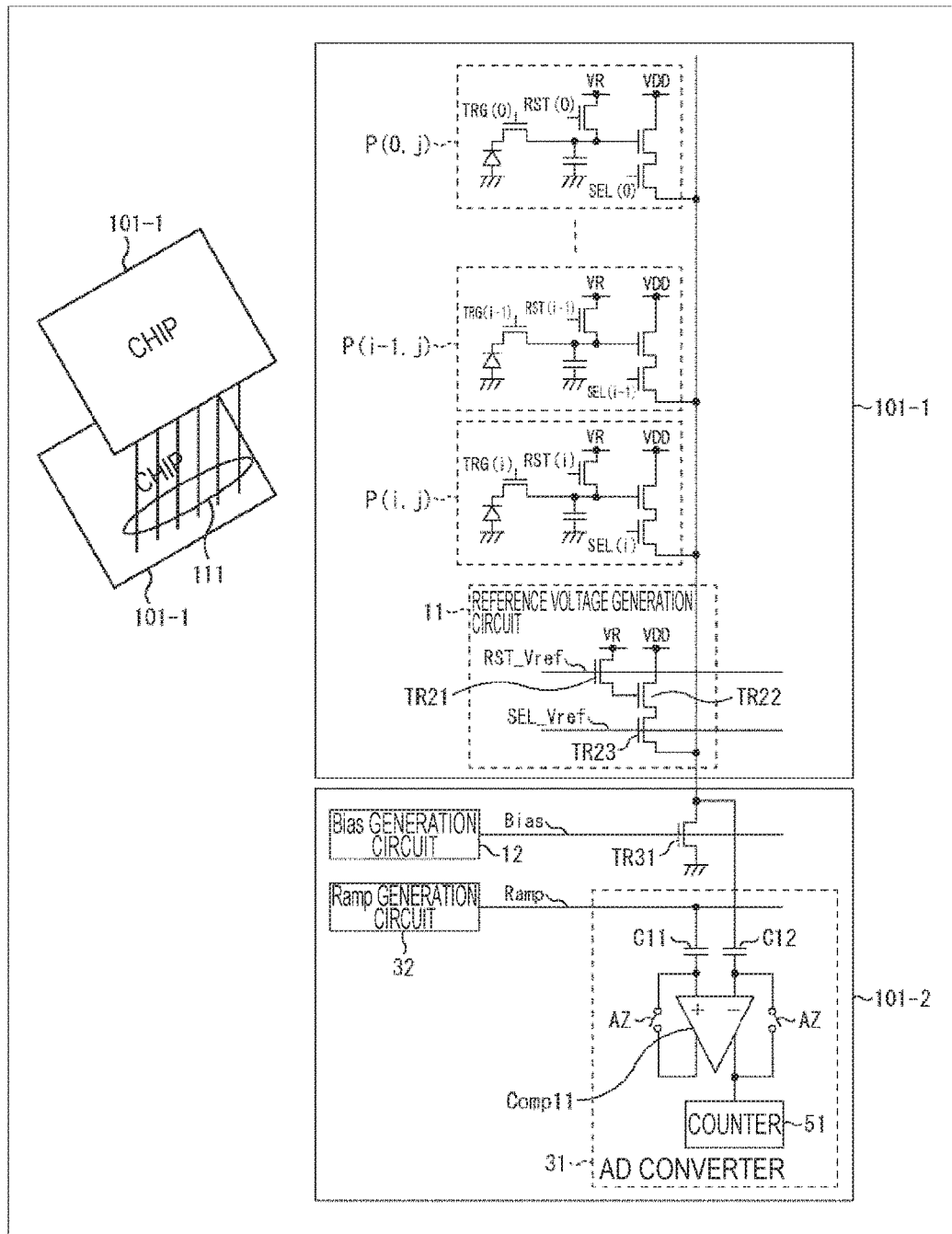
FIG. 9 is a diagram illustrated to describe an exemplary configuration of a fifth embodiment of the solid-state image sensor, which includes two chips, to which the present technology is applied.

In the case of using the two chips 101-1 and 101-2, in one example, as illustrated in the right part of FIG. 9, the pixel P (i, j) and the reference voltage generation circuit 11 may be provided on the chip 101-1, and the Bias generation circuit 12, the transistor TR31, the Ramp generation circuit 32, and the AD converter 31 may be provided on the chip 101-2.

Figure 10:
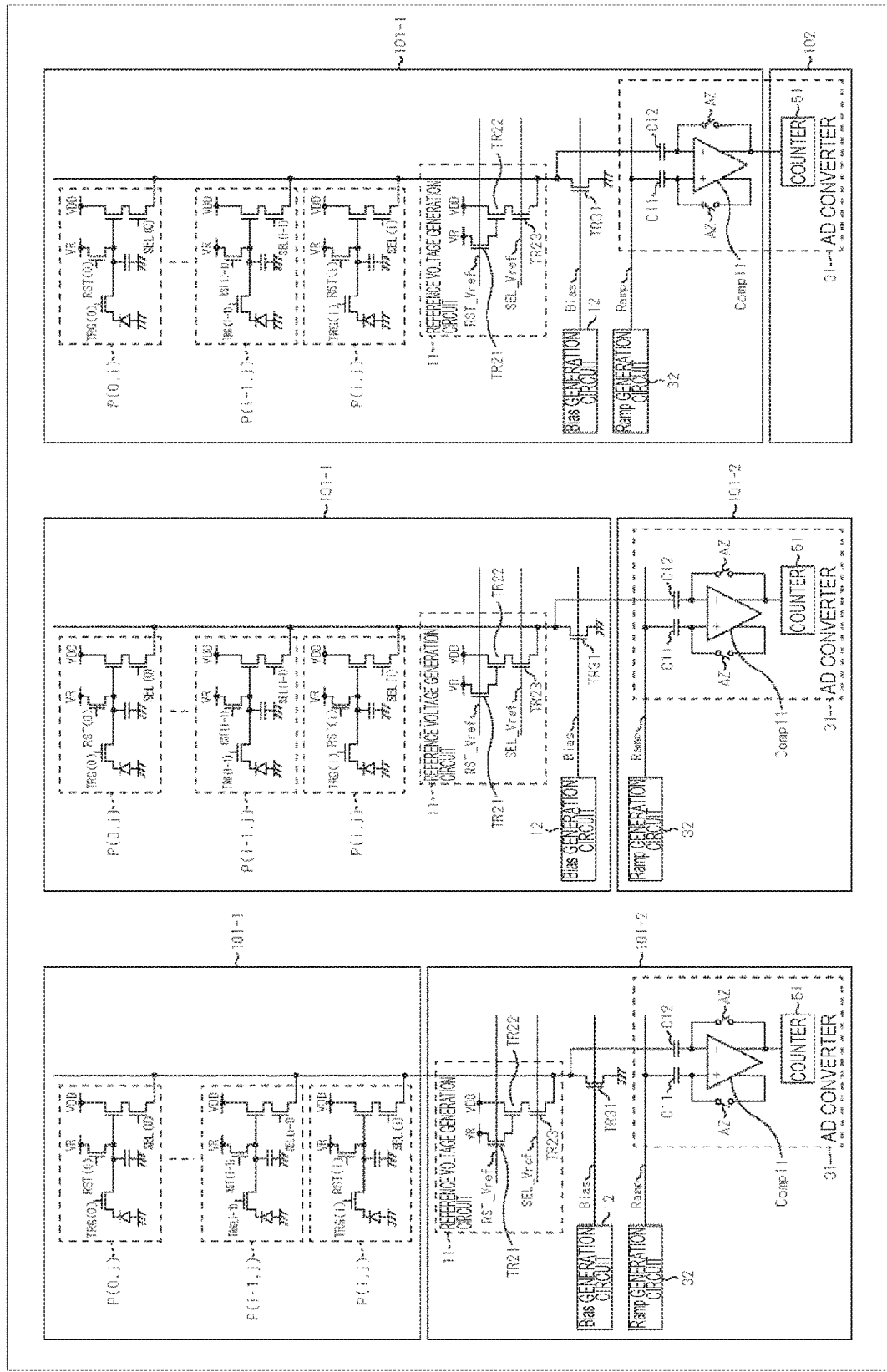
FIG. 10 is a diagram illustrated to describe another exemplary configuration of the fifth embodiment of the solid-state image sensor, which includes two chips, to which the present technology is applied.

Further, as illustrated in the left part of FIG. 10, the pixel P (i, j) may be provided on the chip 101-1, and the reference voltage generation circuit 11, the Bias generation circuit 12, the transistor TR31, the Ramp generation circuit 32, and the AD converter 31 may be provided on the chip 101-2.

Furthermore, as illustrated in the middle part of FIG. 10, the pixel P (i, j), the reference voltage generation circuit 11, the Bias generation circuit 12, and the transistor TR31 may be provided on the chip 101-1, and the Ramp generation circuit 32 and the AD converter 31 may be provided on the chip 101-2.

In addition, as illustrated in the right part of FIG. 10, the pixel P (i, j), the reference voltage generation circuit 11, the Bias generation circuit 12, the transistor TR31, the Ramp generation circuit 32, and the comparator Comp 11, the switch AZ, and the capacitors C11 and C12 of the AD converter 31 may be provided on the chip 101-1, and the counter 51 of the AD converter 31 may be provided on the chip 101-2.

Furthermore, the pixel P (i, j), the reference voltage generation circuit 11, the Bias generation circuit 12, the transistor TR31, the Ramp generation circuit 32, and the AD converter 31 may be distributed on three or more chips.

Sixth Embodiment

In the above, the description is given of the example in which the plurality of vertical transfer lines VLINE (j) are made independent or the gates of the transistors TR21 and TR23 of the reference voltage generation circuit 11 are commonly used. Thus, they are connected to the reset signal RST_Vref and the selection signal SEL_Vref, and the adjacent vertical transfer lines VLINE (j) are connected to each other by the switch VSC_CON. However, the plurality of vertical transfer lines VLINE (j) may be connected to each other by merely using the gates of the transistors TR21 and TR23 of the reference voltage generation circuit 11 in common.

Figure 11:
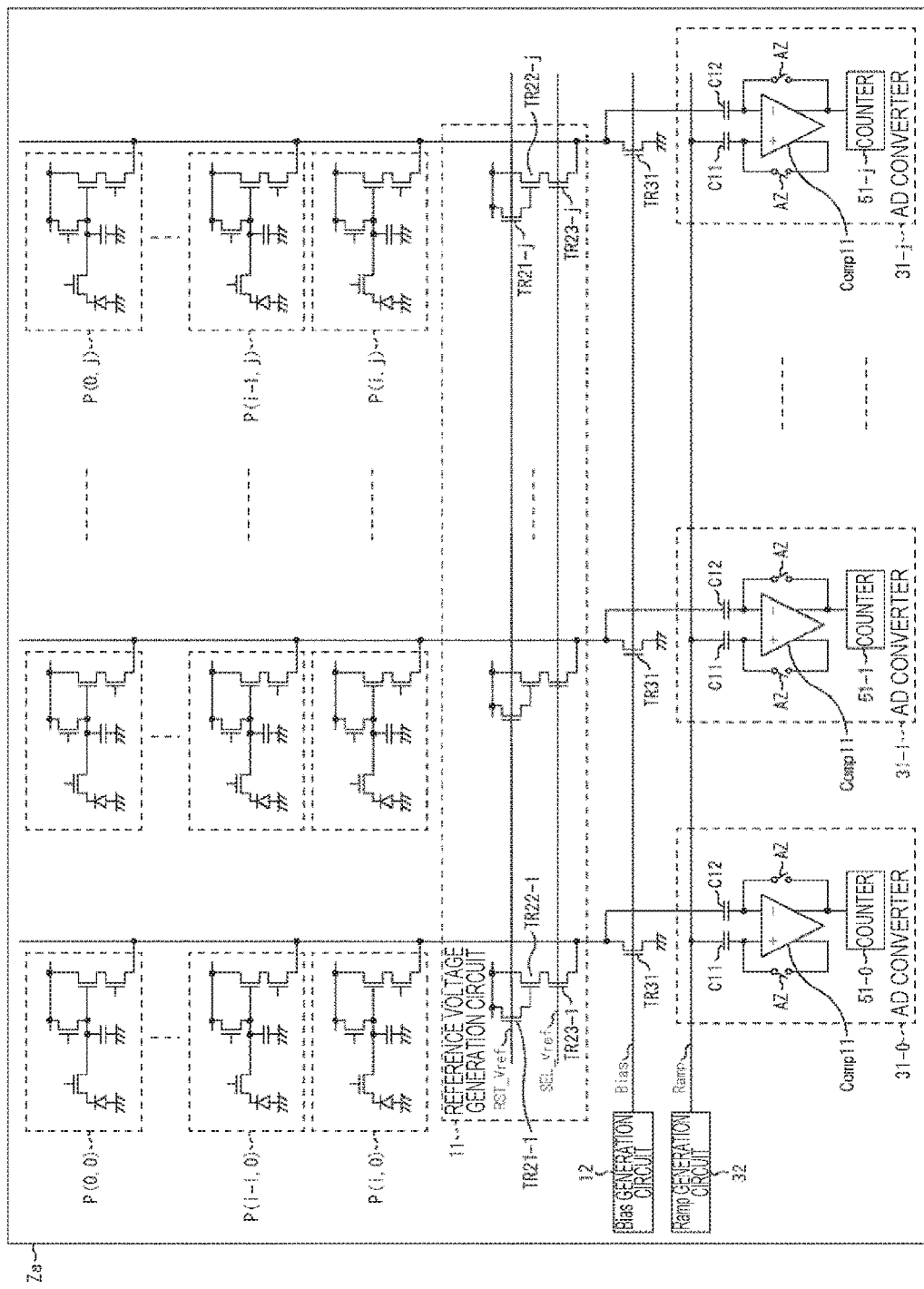
FIG. 11 is a diagram illustrated to describe an exemplary configuration of a sixth embodiment of the solid-state image sensor to which the present technology is applied.

FIG. 11 illustrates an exemplary configuration of a solid-state image sensor in which the plurality of vertical transfer lines VLINE (j) are connected to each other by merely using the gates of the transistors TR21, TR23, and TR31 of the reference voltage generation circuit 11 in common.

In such a configuration as well, the reference voltage generation circuit 11 can apply a voltage substantially the same as the voltage after resetting the FD portion to each of the vertical transfer lines VLINE (j) as the reference voltage.

Seventh Embodiment

In the above, the description is given of the so-called column ADC technique in which the AD converter 31 is provided for each of the vertical transfer lines VLINE (j). However, in one example, a technique may be used in which the effective area of the solid-state image sensor is divided into a plurality of areas, a pixel unit including a plurality of pixels P (i, j) belonging to each area is provided, and an AD converter for AD conversion of a pixel signal that is output on a pixel unit basis is provided.

Figure 12:
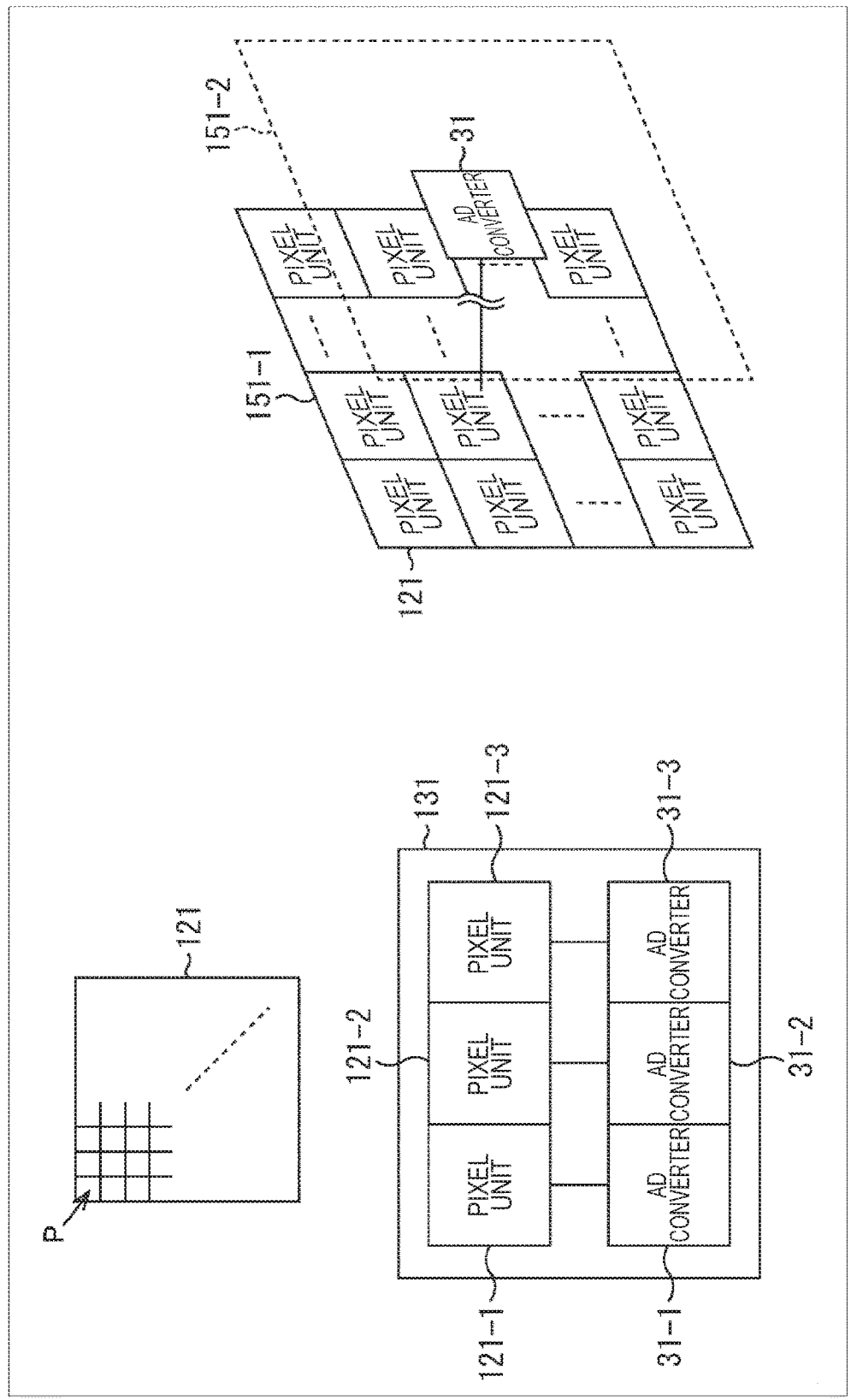
FIG. 12 is a diagram illustrated to describe an exemplary configuration of a seventh embodiment of the solid-state image sensor to which the present technology is applied.

FIG. 12 illustrates an exemplary configuration of a solid-state image sensor of a technique in which an AD converter for AD conversion of a pixel signal that is output on a pixel unit basis is provided. In other words, in the case of the solid-state image sensor using the technique in which an AD converter that performs AD conversion of a pixel signal that is output on a pixel unit basis is provided, as illustrated in the upper left part of FIG. 12, the effective area in the solid-state image sensor is divided into a plurality of pixel units 121 including the plurality of pixels P (i, j). Then, as illustrated in the lower left part of FIG. 12, the AD converter 31 is provided for each of the divided pixel units 121 on one chip 131.

More specifically, in the lower left part of FIG. 12, an example is illustrated in which the pixel units 121-1 to 121-3 in which the effective area is divided into three are provided, and the AD converters 31-1 to 31-3 are respectively connected to them.

Moreover, in the case of the configuration as illustrated in the lower left part of FIG. 12, the pixel unit 121 is configured to include a plurality of pixels P (i, j) in the effective area, a transfer line that transfers the pixel signal of the pixel P (i, j), the reference voltage generation circuit 11, the Bias generation circuit 12, the Ramp generation circuit 32, and the transistor TR 31. The transfer line corresponds to the vertical transfer line VLINE (j).

In this case as well, the configuration of the transistors TR21, TR22, and TR23 in the reference voltage generation circuit 11 is the same as that of the transistors TR11, TR13, TR14 in the pixel P (i, j), respectively. It is possible to generate the reference voltage that is substantially the same as the reset voltage.

In addition, as illustrated in the right part of FIG. 12, the plurality of pixel units 121 may be provided on a chip 151-1 formed of a pixel substrate, the AD converter 31 may be provided on a chip 151-2 formed of a circuit board, and they may be connected by wiring.

Moreover, in generating the reference voltage, it is also possible to use, in one example, a dummy pixel incapable of receiving light, which is called optical black (OPB).

However, the dummy pixel used for the OPB is typically provided at the edge of the image capturing area (effective area) in the solid-state image sensor. As illustrated in the right part of FIG. 12, in one example, in a case where the effective area is divided into 16 areas of 4×4 areas, the pixel unit 121 and the AD converter 31 are provided in association with each other for each of the areas. However, in the case of the pixel unit 121 as described above, each edge serves as a boundary with another area, and so a dummy pixel such as optical black fails to be provided. Thus, there may be a case where it fails to provide an OPB including the technique in which an AD converter that performs AD conversion on a pixel signal that is output on a pixel unit basis is provided such that the effective area is divided into a plurality of pixel units. In this case, it is possible to generate the same reference voltage as the reset voltage of the FD portion by providing the reference voltage generation circuit 11 described above for each pixel unit.

<Method of Writing Reset Voltage of FD>

Figure 13:
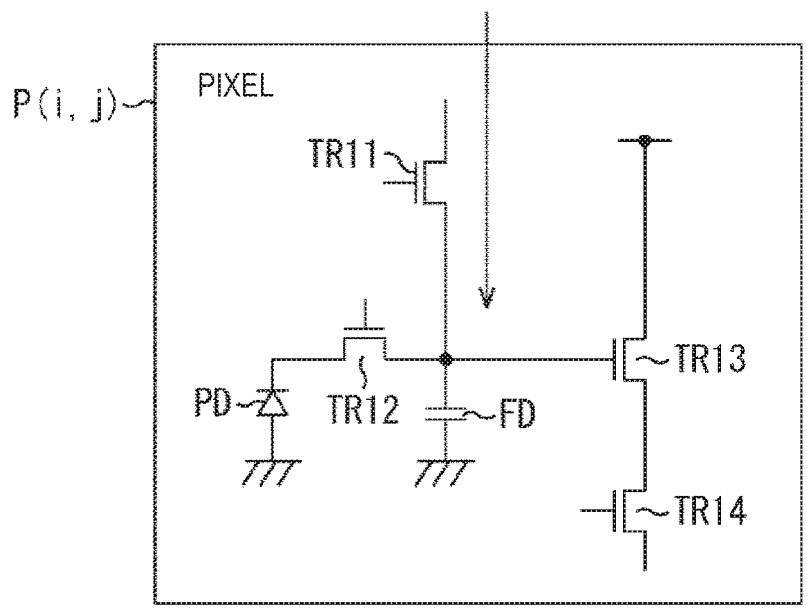
FIG. 13 is a diagram illustrated to describe a method of writing a reset voltage of a typical FD.

In the solid-state image sensor described above, as illustrated by the arrow in FIG. 13, there is a technique of writing the reset voltage that is a predetermined voltage in the FD to reduce variations in the amplification transistor TR13 in performing the global shutter operation of the FD accumulation type.

However, at this event, the voltage of the FD may vary due to coupling between FDs in adjacent pixel columns in some cases.

Figure 14:
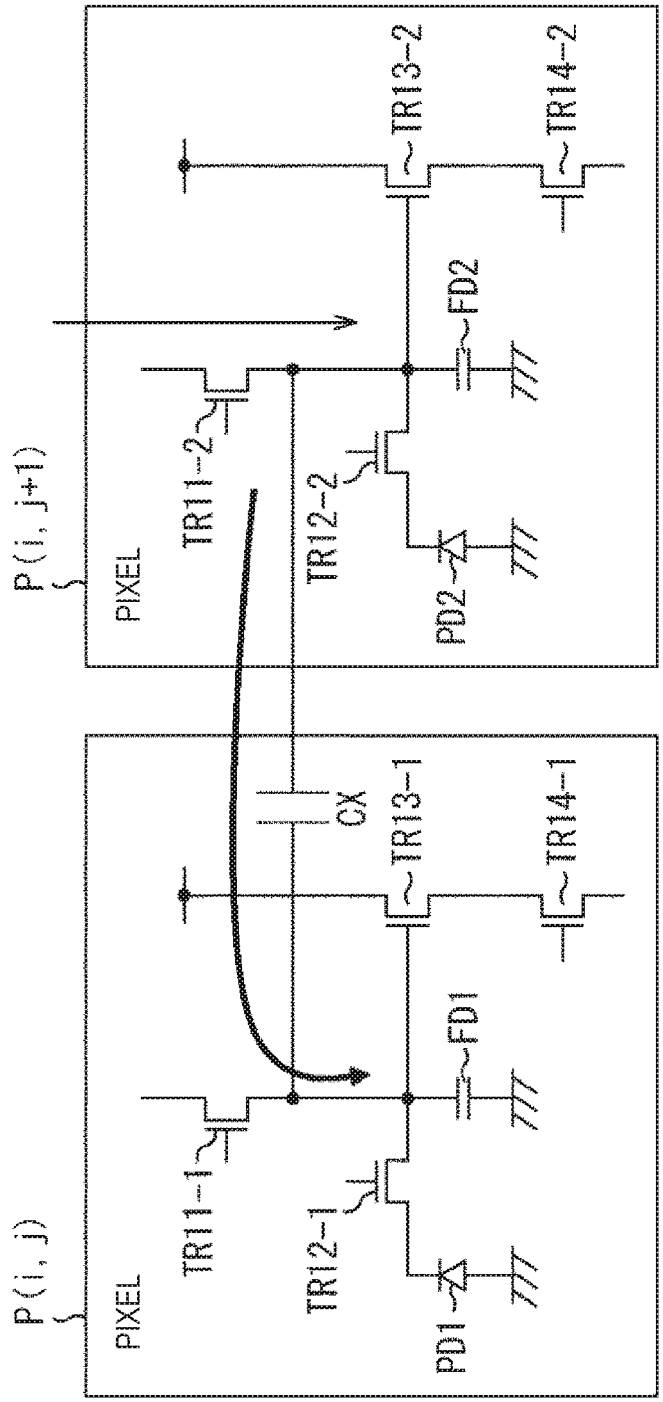
FIG. 14 is a diagram illustrated to describe parasitic coupling capacitance caused by adjacent FDs.

In other words, as illustrated in FIG. 14, there is a case where the pixel P (i, j) and the pixel P (i, j+1) are adjacent to each other. In this case, in a state in which writing of the reset voltage in the FD1 in the pixel P (i, j) is completed, if the reset voltage is written in the FD2 in the adjacent pixel P (i, j+1) as indicated by the thin arrow, the reset voltage of the FD1 that has been written will vary under the influence of parasitic coupling capacitance Cx as indicated by the thick arrow.

Moreover, the parasitic coupling capacitance Cx in FIG. 14 is a schematic representation of the parasitic capacitance in the circuit, and actually does not exist as a circuit.

Figure 15:
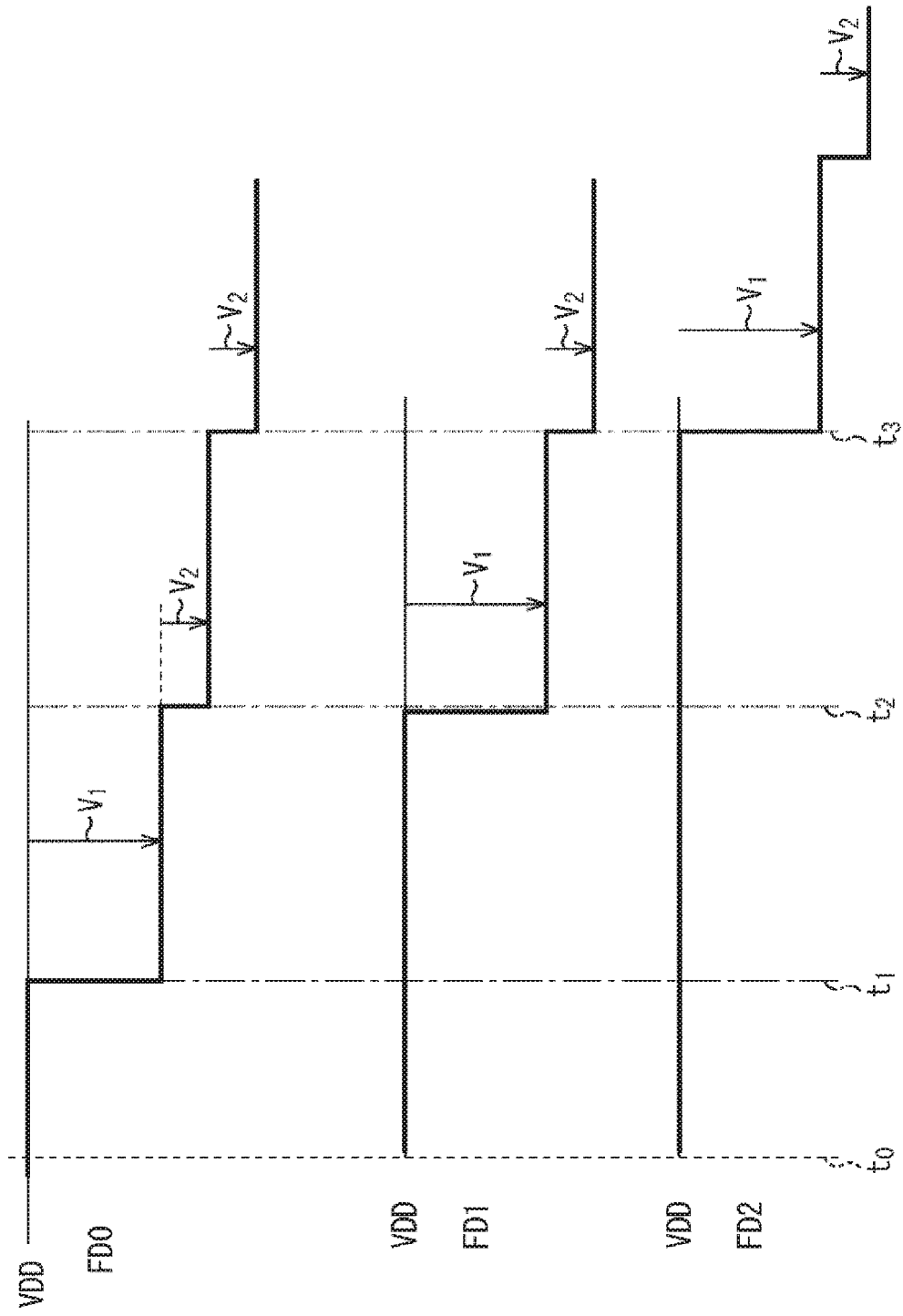
FIG. 15 is a diagram illustrated to describe an influence of parasitic coupling capacitance.

More specifically, in a case where three pixels are adjacent to each other, when FD for each of the pixels are set as FD0 to FD2, the voltage changes as illustrated in FIG. 15.

In other words, at a first time point indicated by time t0, the FD0 to FD2 are both the power supply voltage VDD.

Here, at time t1, the reset voltage is written in the FD0, and so a voltage (VDD−V1) serving as the reset voltage is written as the voltage of the FD0.

Next, at time t2, the voltage (VDD−V1) serving as the reset voltage is written in the FD1. At this event, in the FD0 in which the voltage (VDD−V1) has been written as the reset voltage, the influence of the parasitic coupling capacitance causes a voltage drop. The voltage further decreases from the voltage (VDD−V1) serving as the reset voltage by the voltage V2, then it is set to a voltage (VDD−V1−V2). Moreover, the voltage V2 is, in one example, about 1/100 of the voltage V1.

Furthermore, at time t3, the voltage (VDD−V1) is written in the FD 2 as the reset voltage. At this event, in the FD1 in which the voltage (VDD−V1) has been written as the reset voltage, the influence of the parasitic coupling capacitance causes a voltage drop, and the voltage is set to a voltage (VDD−V1−V2) that is further lower than the reset voltage. Furthermore, at this event, the FD0 is also affected, and so the reset voltage of the FD0 is set to a lower voltage (VDD−V1−2×V2).

When the reset voltage is sequentially set to each FD in this way, the reset voltage of the surrounding FD that has been reset will be decreased each time.

Consequently, it is not possible to write a uniform reset voltage in all FDs, which will cause variations.

Thus, the above-described processing allows a second reset voltage write operation to be performed on all the FDs after performing the operation of writing the reset voltage in the FDs of all the pixels.

Figure 16:
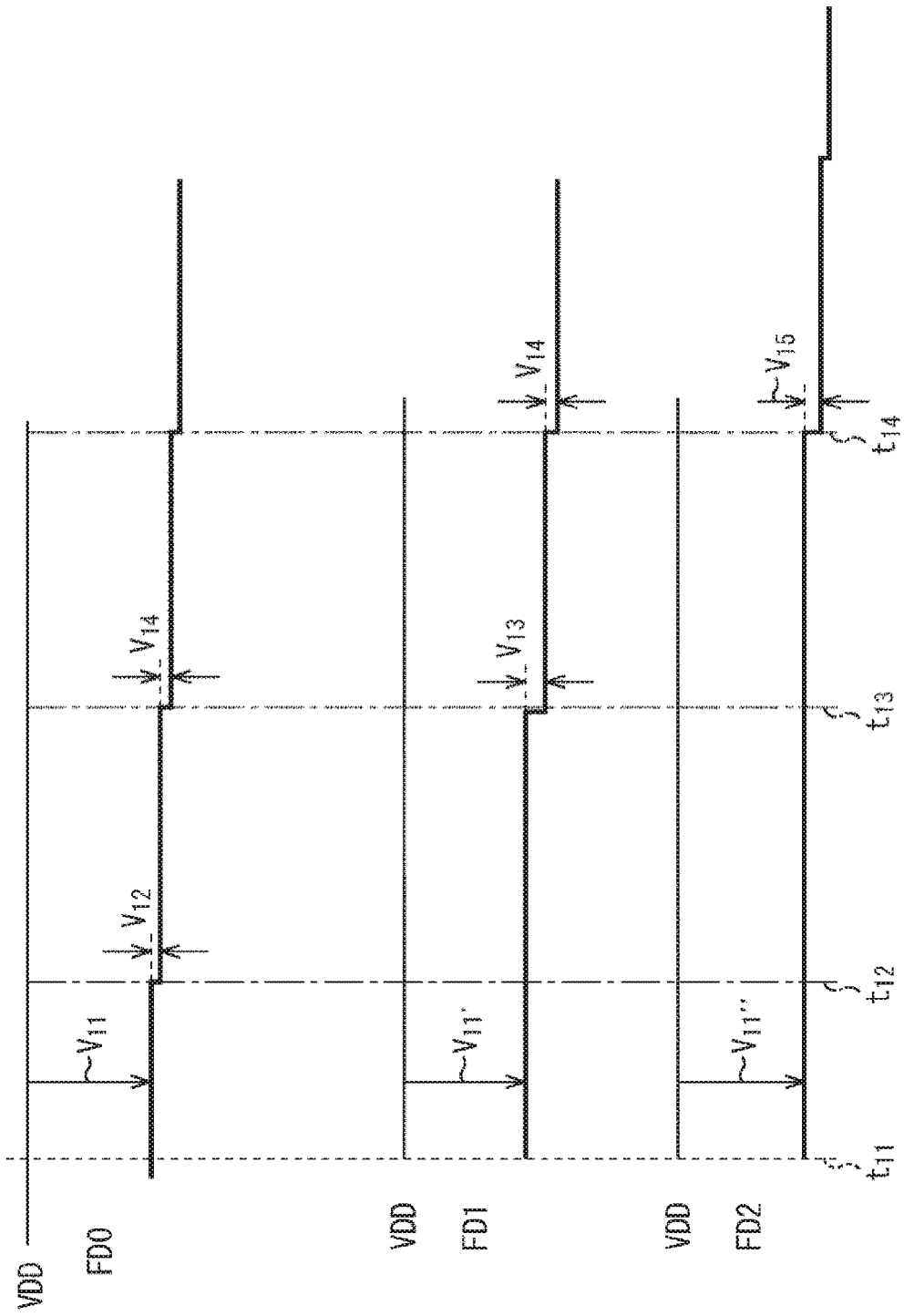
FIG. 16 is a diagram illustrated to describe a method of writing a reset voltage of an FD to which the present technology is applied.

More specifically, as illustrated in FIG. 16, voltages V11, V11', and V11" with some variations are written in the FD0 to FD2, respectively, at time t11 by writing of the first reset voltage.

Here, as illustrated at time t12, the voltage (V11−V12) (=V1) is written in the FD0 to set the voltage corresponding to the initial reset voltage V1.

Next, as illustrated at time t13, the reset voltage V11'−V13 (=V1) is written in the FD1 to set it to the initial reset voltage V1.

At this event, the FD0 is in a state where the reset voltage is written, and so the influence of the parasitic coupling capacitance Cx with the FD 1 causes a voltage drop by about the voltage V14. However, at this event, the voltage V13 that is the voltage change in the FD1 is a change in voltages finely adjusted merely by the reset voltage V1, and so the influence of the parasitic coupling capacitance Cx on this voltage shift becomes extremely small. Consequently, the FD0 can be considered to be a state in which the reset voltage V1 is written.

Similarly, as illustrated at time t14, the reset voltage V11"−V15 (=V1) is written in the FD2 to set it to the initial reset voltage V1.

At this event, the FD0 and the FD1 are both in the state in which the reset voltage is written, and so their voltages decrease by about the voltage V14 under the influence of the parasitic coupling capacitance Cx with the FD2. However, in this event as well, the voltage V15 that is the voltage change in the FD2 is a change in voltages finely adjusted merely by the reset voltage V1, and so the influence of the parasitic coupling capacitance Cx on this voltage shift becomes extremely small. Consequently, the FD0 and the FD1 can be considered to be a state in which the reset voltage V1 is written.

In this manner, the reset voltage is written twice in all the FDs, and so it is possible to reduce variations in the write voltages for all the FDs.

<Example of Application to Electronic Device>

The solid-state image sensor described above is applicable to various electronic devices including an image capturing device such as a digital still camera or a digital video camera, a mobile phone having an image capturing function, or other devices having an image capturing function.

Figure 17:
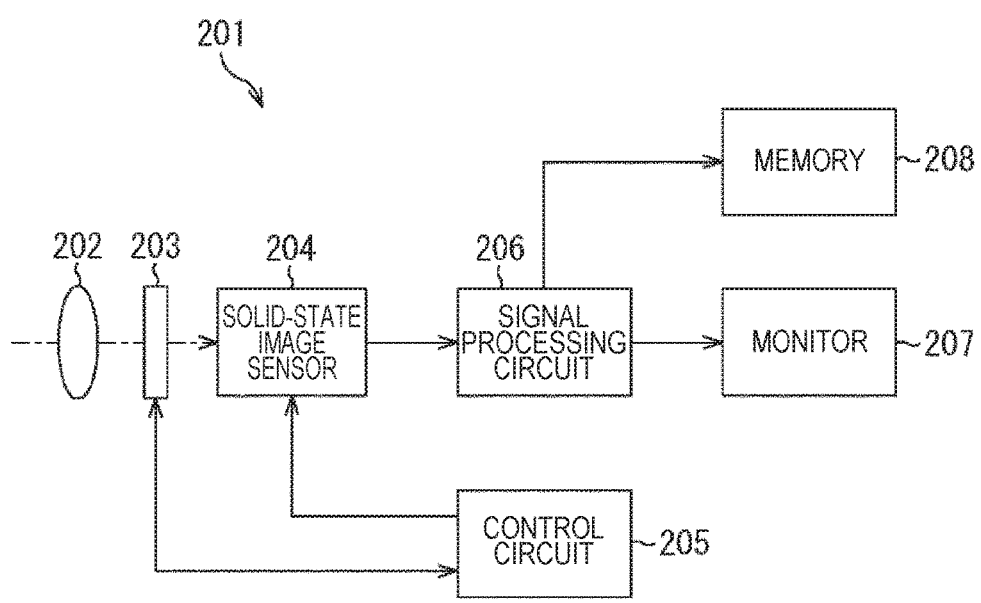
FIG. 17 is a diagram illustrated to describe a configuration of an image capturing device and an electronic device using a solid-state image sensor including a semiconductor image sensor to which the present technology is applied.

FIG. 17 is a block diagram illustrating an exemplary configuration of an image capturing device as an electronic device to which the present technology is applied.

An image capturing device 201 illustrated in FIG. 17 is configured to include an optical system 202, a shutter unit 203, a solid-state image sensor 204, a drive circuit 205, a signal processing circuit 206, a monitor 207, and a memory 208, and is capable of capturing a still image and a moving image.

The optical system 202 is configured to include one or a plurality of lenses, and guides the light (incident light) from a subject to the solid-state image sensor 204 to form an image on the light receiving surface of the solid-state image sensor 204.

The shutter unit 203 is arranged between the optical system 202 and the solid-state image sensor 204, and controls the exposure time interval and the light blocking time interval for the solid-state image sensor 204 under the control of the drive circuit 1005.

The solid-state image sensor 204 is configured by a package including the solid-state image sensor of FIGS. 1, 4, and 6 to 12 described above. The solid-state image sensor 204 accumulates the signal electric charge for a predetermined period depending on light formed on the light receiving surface via the optical system 202 and the shutter unit 203. The signal electric charges accumulated in the solid-state image sensor 204 are transferred in accordance with a drive signal (timing signal) supplied from the drive circuit 205.

The drive circuit 205 outputs a driving signal that controls the transfer operation of the solid-state image sensor 204 and the shutter operation of the shutter unit 203 and drives the solid-state image sensor 204 and the shutter unit 203.

The signal processing circuit 206 performs various signal processing on the signal electric charge that is output from the solid-state image sensor 204. An image (image data) obtained by performing signal processing by the signal processing circuit 206 is supplied to the monitor 207 and displayed, or supplied to the memory 208 and stored (recorded) therein.

The image capturing device 201 as described above can achieve image capturing with reduced noise at all pixels by applying the solid-state image sensor 1 illustrated in FIGS. 1, 4, and 6 to 12 in place of the above-described solid-state image sensor 204.

<Example of Use of Solid-State Image Sensor>

Figure 18:
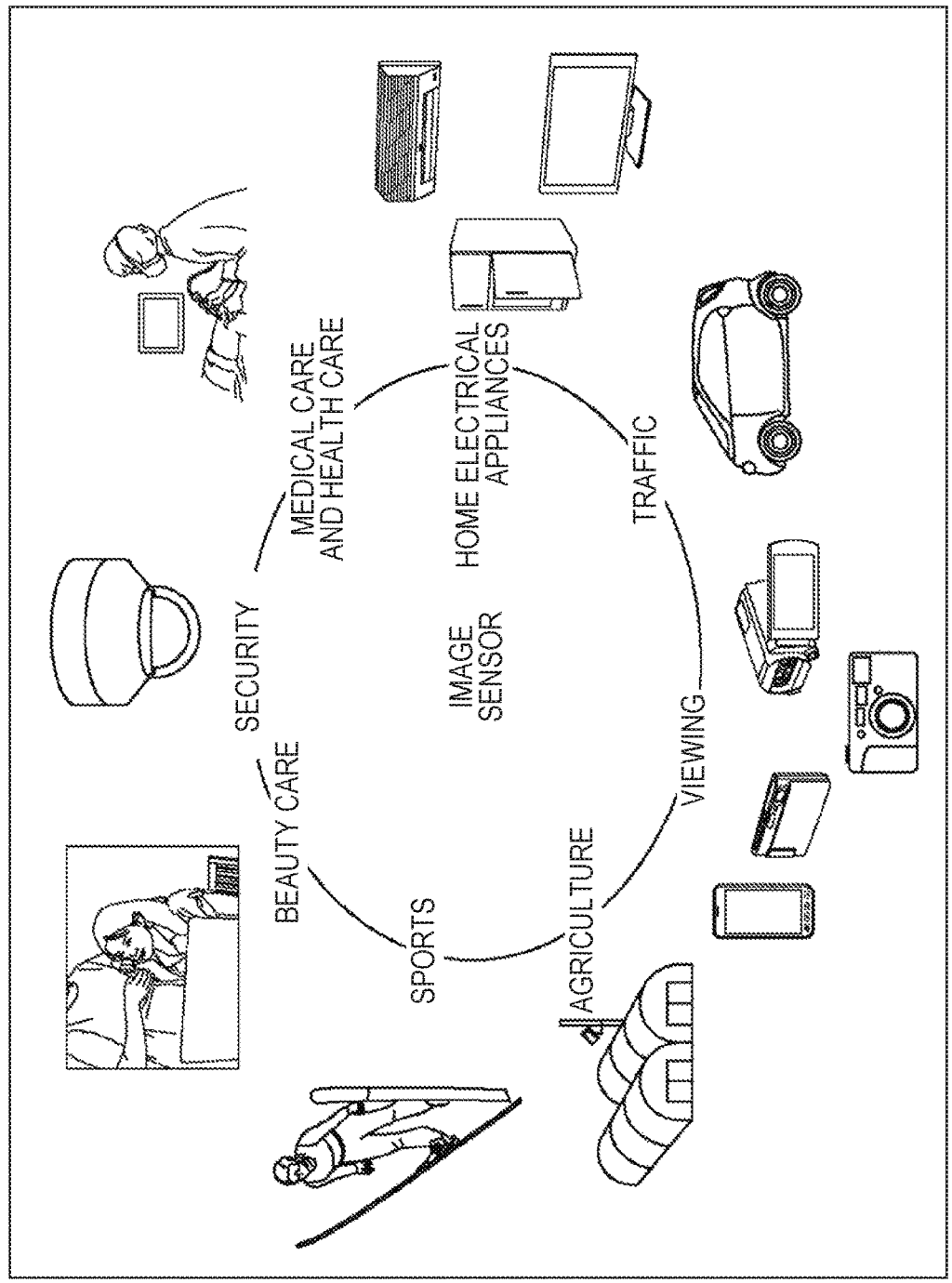
FIG. 18 is a diagram illustrating an example of use of a solid-state image sensor.

FIG. 18 is a diagram illustrated to describe an example of the use of the solid-state image sensor illustrated in FIGS. 1, 4, and 6 to 12 as described above.

The solid-state image sensor illustrated in FIGS. 1, 4, and 6 to 12 as described above can be used for, in one example, various cases of detection of light such as visible light, infrared light, ultraviolet light, or X-rays as follows.

- Devices that capture an image provided for viewing, such as a digital camera and a portable appliance with a camera function
- Devices used for traffic, including an in-vehicle sensor that captures an image of the front, back, surroundings, inside, or the like of a car, a monitoring camera that monitors travelling vehicles or roads, a distance sensor that measures a distance between vehicles or the like, which are used for the safe driving such as automatic stop, recognition of the condition of a driver, or the like
- Devices used for home electrical appliances including TVs, refrigerators, and air conditioners, which are used to capture an images of the user's gesture and perform the device operation in accordance with the gesture
- Devices used for medical care or health care, including an endoscope and a device that performs angiography by reception of infrared light
- Devices used for security, including a monitoring camera for crime prevention and a camera for personal authentication
- Devices used for beauty care, including skin measurement equipment that captures an image of the skin and a microscope that captures an image of the scalp
- Devices used for sports, including an action camera or wearable camera for sports and the like
- Devices used for agriculture, including a camera for monitoring the condition of the field and crops Additionally, the present technology may also be configured as below.

(1)

A solid-state image sensor including:

a source follower circuit configured to generate a reference voltage, in which a gate voltage of an amplification transistor included in the source follower circuit is equal to a reset voltage in resetting an electric charge accumulated in a floating diffusion that accumulates an electric charge generated by a photodiode included in a pixel circuit for each pixel, and a switch is disposed on a wiring between the gate and a power supply that applies a voltage to the gate, and the switch, when being turned off, sets the voltage to be applied to the gate to be a value equal to a voltage of the floating diffusion obtained after the resetting.

(2)

The solid-state image sensor according to (1), in which the source follower circuit generates the reference voltage when the switch is turned on.

(3)

The solid-state image sensor according to (1), in which the source follower circuit is set for each column divided in a horizontal direction, is provided for each vertical transfer line that transfers a signal of each pixel in a vertical direction, and applies the reference voltage to the vertical transfer line.

(4)

The solid-state image sensor according to (3), in which a plurality of the adjacent vertical transfer lines are connected to each other by commonly using a gate of a transistor serving as the switch.

(5)
The solid-state image sensor according to (3),
in which the adjacent vertical transfer lines are connected to each other via a switch and the switch is turned on at a timing immediately before reading the signal of the pixel.
(6)
The solid-state image sensor according to any of (1) to (5),
in which a power supply that supplies the reset voltage and a power supply that supplies a voltage as the reference voltage via the switch are identical power supplies.
(7)
The solid-state image sensor according to any of (1) to (5),
in which a power supply that supplies the reset voltage and a power supply that supplies a voltage as the reference voltage via the switch are individual power supplies.
(8)
The solid-state image sensor according to any of (1) to (7),
in which a signal of the pixel to be output via the vertical transfer line is output to an auto-zero circuit.
(9)
The solid-state image sensor according to (1) to (8),
in which a signal of the pixel to be output via the vertical transfer line is output to an analog/digital (AD) converter.
(10)
The solid-state image sensor according to any of (1) to (9),
in which a main body circuit configuration includes one chip.
(11)
The solid-state image sensor according to any of (1) to (10), in which a main body circuit configuration includes a plurality of chips.
(12)
The solid-state image sensor according to (11),
in which, in a case where the main body circuit configuration includes two chips, the pixel circuit is included in a first chip and the source follower circuit and an analog/digital (AD) converter are included in a second chip.
(13)
The solid-state image sensor according to (11),
in which, in a case where the main body circuit configuration includes two chips, the pixel circuit and the source follower circuit are included in a first chip and an analog/digital (AD) converter is included in a second chip.
(14)
The solid-state image sensor according to (11),
in which, in a case where the main body circuit configuration includes two chips, the pixel circuit, the source follower circuit, and a comparator of an analog/digital (AD) converter are included in a first chip and a counter of the analog/digital (AD) converter is included in a second chip.
(15)
The solid-state image sensor according to (1),
in which the source follower circuit is provided for each area transfer line used to transfer a signal of each pixel in each of areas divided in a two-dimensional direction, and applies the reference voltage to the area transfer line.
(16)
The solid-state image sensor according to (15),
in which a main body circuit configuration includes a first chip including the pixel circuit provided for each of the areas and a second chip including a source follower circuit provided for each of the areas.

(17)
An image capturing device including:
a source follower circuit configured to generate a reference voltage,
in which a gate voltage of an amplification transistor included in the source follower circuit is equal to a reset voltage in resetting an electric charge accumulated in a floating diffusion that accumulates an electric charge generated by a photodiode included in a pixel circuit for each pixel, and
a switch is disposed on a wiring between the gate and a power supply that applies a voltage to the gate, and the switch, when being turned off, sets the voltage to be applied to the gate to be a value equal to a voltage of the floating diffusion obtained after the resetting.
(18)
An electronic device including:
a source follower circuit configured to generate a reference voltage,
in which a gate voltage of an amplification transistor included in the source follower circuit is equal to a reset voltage in resetting an electric charge accumulated in a floating diffusion that accumulates an electric charge generated by a photodiode included in a pixel circuit for each pixel, and
a switch is disposed on a wiring between the gate and a power supply that applies a voltage to the gate, and the switch, when being turned off, sets the voltage to be applied to the gate to be a value equal to a voltage of the floating diffusion obtained after the resetting.

REFERENCE SIGNS LIST

11 reference voltage generation circuit
12 Bias generation circuit
13 Vampref generation circuit
14 auto-zero circuit
31, 31-1 to 31-3 AD converter
32 Ramp generation circuit
51 counter
101, 101-1, 101-2 chip
121, 121-1 to 121-3 pixel unit
151, 152 chip

The invention claimed is:
1. A solid-state image sensor comprising:
  a source follower circuit configured to generate a reference voltage,
  wherein a gate voltage of an amplification transistor included in the source follower circuit is equal to a reset voltage in resetting an electric charge accumulated in a floating diffusion that accumulates an electric charge generated by a photodiode included in a pixel circuit for each pixel, and
  a switch is disposed on a wiring between the gate and a power supply that applies a voltage to the gate, and the switch, when being turned off, sets the voltage to be applied to the gate to be a value equal to a voltage of the floating diffusion obtained after the resetting.
2. The solid-state image sensor according to claim 1,
  wherein the source follower circuit generates the reference voltage when the switch is turned on.
3. The solid-state image sensor according to claim 1,
  wherein the source follower circuit is set for each column divided in a horizontal direction, is provided for each vertical transfer line that transfers a signal of each pixel in a vertical direction, and applies the reference voltage to the vertical transfer line.

4. The solid-state image sensor according to claim 3,
wherein a plurality of adjacent vertical transfer lines are connected to each other by commonly using a gate of a transistor serving as the switch.

5. The solid-state image sensor according to claim 3,
wherein a plurality of adjacent vertical transfer lines are connected to each other via a switch and the switch is turned on at a timing immediately before reading the signal of the pixel.

6. The solid-state image sensor according to claim 1,
wherein a power supply that supplies the reset voltage and a power supply that supplies a voltage as the reference voltage via the switch are identical power supplies.

7. The solid-state image sensor according to claim 1,
wherein a power supply that supplies the reset voltage and a power supply that supplies a voltage as the reference voltage via the switch are individual power supplies.

8. The solid-state image sensor according to claim 1,
wherein a signal of the pixel to be output via a vertical transfer line is output to an auto-zero circuit.

9. The solid-state image sensor according to claim 1,
wherein a signal of the pixel to be output via a vertical transfer line is output to an AD converter.

10. The solid-state image sensor according to claim 1,
wherein a main body circuit configuration includes one chip.

11. The solid-state image sensor according to claim 1,
wherein a main body circuit configuration includes a plurality of chips.

12. The solid-state image sensor according to claim 11,
wherein, in a case where the main body circuit configuration includes two chips, the pixel circuit is included in a first chip and the source follower circuit and an analog/digital (AD) converter are included in a second chip.

13. The solid-state image sensor according to claim 11,
wherein, in a case where the main body circuit configuration includes two chips, the pixel circuit and the source follower circuit are included in a first chip and an analog/digital (AD) converter is included in a second chip.

14. The solid-state image sensor according to claim 11,
wherein, in a case where the main body circuit configuration includes two chips, the pixel circuit, the source follower circuit, and a comparator of an analog/digital (AD) converter are included in a first chip and a counter of the AD converter is included in a second chip.

15. The solid-state image sensor according to claim 1,
wherein the source follower circuit is provided for each area transfer line used to transfer a signal of each pixel in each of the areas divided in a two-dimensional direction, and applies the reference voltage to the area transfer line.

16. The solid-state image sensor according to claim 15,
wherein a main body circuit configuration includes a first chip including the pixel circuit provided for each of the areas and a second chip including a source follower circuit provided for each of the areas.

17. An image capturing device comprising:
a source follower circuit configured to generate a reference voltage,
wherein a gate voltage of an amplification transistor included in the source follower circuit is equal to a reset voltage in resetting an electric charge accumulated in a floating diffusion that accumulates an electric charge generated by a photodiode included in a pixel circuit for each pixel, and
a switch is disposed on a wiring between the gate and a power supply that applies a voltage to the gate, and the switch, when being turned off, sets the voltage to be applied to the gate to be a value equal to a voltage of the floating diffusion obtained after the resetting.

18. An electronic device comprising:
a source follower circuit configured to generate a reference voltage,
wherein a gate voltage of an amplification transistor included in the source follower circuit is equal to a reset voltage in resetting an electric charge accumulated in a floating diffusion that accumulates an electric charge generated by a photodiode included in a pixel circuit for each pixel, and
a switch is disposed on a wiring between the gate and a power supply that applies a voltage to the gate, and the switch, when being turned off, sets the voltage to be applied to the gate to be a value equal to a voltage of the floating diffusion obtained after the resetting.

* * * * *